(12) United States Patent
Maruyama et al.

(10) Patent No.: US 10,503,067 B2
(45) Date of Patent: Dec. 10, 2019

(54) PHOTOSENSITIVE RESIN COMPOSITION, PHOTOSENSITIVE DRY FILM, PHOTOSENSITIVE RESIN COATING, AND PATTERN FORMING PROCESS

(71) Applicant: Shin-Etsu Chemical Co., Ltd., Tokyo (JP)

(72) Inventors: Hitoshi Maruyama, Annaka (JP); Kazunori Kondo, Annaka (JP); Hideyoshi Yanagisawa, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 9 days.

(21) Appl. No.: 15/883,265

(22) Filed: Jan. 30, 2018

(65) Prior Publication Data

US 2018/0224743 A1    Aug. 9, 2018

(30) Foreign Application Priority Data

Feb. 3, 2017    (JP) ................. 2017-018353

(51) Int. Cl.

| | | |
|---|---|---|
| *G03F 7/038* | (2006.01) | |
| *G03F 7/075* | (2006.01) | |
| *G03F 7/30* | (2006.01) | |
| *C08G 73/22* | (2006.01) | |
| *C08L 83/04* | (2006.01) | |
| *G03F 7/039* | (2006.01) | |

(52) U.S. Cl.
CPC ........... *G03F 7/0388* (2013.01); *C08G 73/22* (2013.01); *C08L 83/04* (2013.01); *G03F 7/039* (2013.01); *G03F 7/0387* (2013.01); *G03F 7/0757* (2013.01)

(58) Field of Classification Search
CPC .... G03F 7/0757; G03F 7/0392; G03F 7/0387; G03F 7/0388; G03F 7/30; C08G 77/22; C08G 77/26; C08G 77/52; C08G 73/22
USPC .............................. 430/270.1, 325, 906, 927
See application file for complete search history.

(56) References Cited

U.S. PATENT DOCUMENTS

| | | |
|---|---|---|
| 6,590,010 B2 | 7/2003 | Kato et al. |
| 7,785,766 B2 | 8/2010 | Kato et al. |
| 2011/0061914 A1* | 3/2011 | Sekito .................. C08G 18/341 174/258 |

FOREIGN PATENT DOCUMENTS

| | | |
|---|---|---|
| EP | 1186624 A1 | 3/2002 |
| EP | 1953183 A2 | 8/2008 |
| JP | 2002-88158 A | 3/2002 |
| JP | 2008-184571 A | 8/2008 |

* cited by examiner

*Primary Examiner* — John S Chu
(74) *Attorney, Agent, or Firm* — Westerman, Hattori, Daniels & Adrian, LLP

(57) ABSTRACT

A photosensitive resin composition comprising (A) a silicone-modified polybenzoxazole resin and (B) a photoacid generator which is decomposed to generate an acid upon exposure to radiation of 190-500 nm is coated onto a substrate to form a thick coating, which is exposed to radiation, baked, and developed to form a pattern. The resin coating is capable of forming a fine pattern and has improved crack resistance and other film properties, and reliability.

12 Claims, No Drawings

PHOTOSENSITIVE RESIN COMPOSITION, PHOTOSENSITIVE DRY FILM, PHOTOSENSITIVE RESIN COATING, AND PATTERN FORMING PROCESS

CROSS-REFERENCE TO RELATED APPLICATION

This non-provisional application claims priority under 35 U.S.C. § 119(a) on Patent Application No. 2017-018353 filed in Japan on Feb. 3, 2017, the entire contents of which are hereby incorporated by reference.

TECHNICAL FIELD

This invention relates to a photosensitive resin composition, photosensitive dry film, photosensitive resin coating, and pattern forming process.

BACKGROUND ART

In the prior art, photosensitive protective films for semiconductor devices and photosensitive insulating films for multilayer printed circuit boards are formed of photosensitive polyimide compositions, photosensitive epoxy resin compositions, photosensitive silicone compositions, and the like. As the photosensitive material applied for the protection of such substrates and circuits, Patent Document 1 discloses a photosensitive silicone composition. This photosensitive silicone composition is curable at low temperature and forms a coating which is flexible and fully reliable with respect to moisture resistant adhesion and other properties, but is less resistant against chemicals such as photoresist strippers having a high dissolving power, typically N-methyl-2-pyrrolidone (NMP).

To overcome the problem, Patent Document 2 proposes a photosensitive silicone composition based on a silphenylene structure-bearing silicone polymer. This composition is improved in chemical resistance against photoresist strippers and the like, but still has the problem that the cured coating peels from the substrate or cracks in a thermal cycling test (repeating 1,000 cycles a test of holding at −25° C. for 10 minutes and holding at 125° C. for 10 minutes). A further improvement in the reliability of such resin compositions is desired.

CITATION LIST

Patent Document 1: JP-A 2002-088158 (U.S. Pat. No. 6,590,010, EP 1186624)
Patent Document 2: JP-A 2008-184571 (U.S. Pat. No. 7,785,766, EP 1953183)

DISCLOSURE OF INVENTION

An object of the invention is to provide a photosensitive resin composition which forms a resin coating or resin layer that can be processed in thick film form to define a fine size pattern, has improved film properties including crack resistance and adhesion to substrates for use in electronic parts and semiconductor devices and supports for use in circuit boards, and is thus reliable as a protective film for electric and electronic parts and a film for bonding substrates. Another object is to provide a photosensitive dry film, a photosensitive resin coating, and a pattern forming process, using the composition.

The inventors have found that a silicone-modified polybenzoxazole resin having crosslinking groups or crosslinking reaction-susceptible reactive sites in the molecule functions to provide a sufficient film-forming ability; that from a composition comprising the resin, a photosensitive resin coating can be formed to a wide range of thickness; and that the photosensitive resin coating has improved adhesion to substrates, electronic parts and semiconductor devices, a pattern forming ability, crack resistance, heat resistance, electric insulation, and reliability as insulating protective film, and is thus useful as a protective film for electric and electronic parts and a film for bonding substrates.

In one aspect, the invention provides a photosensitive resin composition comprising (A) a silicone-modified polybenzoxazole resin comprising repeating units having the formula (1a) and repeating units having the formula (1b), and (B) a photoacid generator which is decomposed to generate an acid upon exposure to radiation of wavelength 190 to 500 nm.

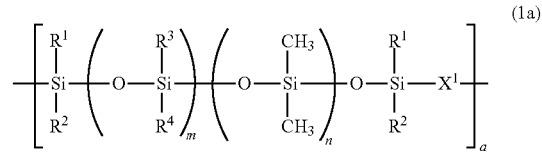

(1a)

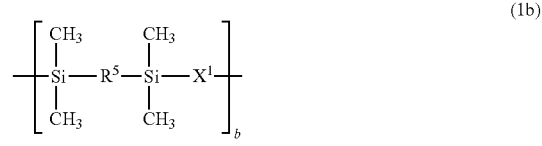

(1b)

Herein $R^1$ to $R^4$ are each independently a $C_1$-$C_8$ monovalent hydrocarbon group which may contain a glycidyl, acryloyl or methacryloyl moiety, m and n are each independently an integer of 0 to 300, $R^5$ is a straight, branched or cyclic $C_1$-$C_8$ alkylene group or phenylene group, a and b are positive numbers in the range: $0<a<1$, $0<b<1$, and $a+b=1$, and $X^1$ is a divalent linker having the following formula (2).

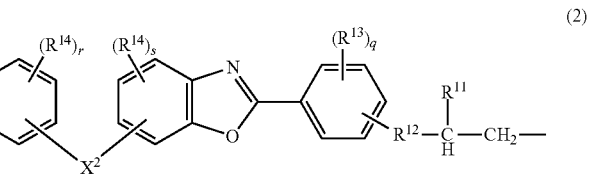

(2)

Herein $X^2$ is a single bond or divalent organic group, $R^{11}$ is each independently hydrogen or a $C_1$-$C_8$ monovalent hydrocarbon group in which some hydrogen may be substituted by halogen, $R^{12}$ is each independently a straight, branched or cyclic $C_1$-$C_8$ alkylene group in which any methylene moiety may be substituted by an ether bond or phenylene moiety, $R^{13}$ is each independently a hydroxyl or glycidyloxy group, $R^{14}$ is each independently a $C_1$-$C_8$ monovalent hydrocarbon group in which some hydrogen may be substituted by halogen, p and q are each independently an integer of 0 to 4, and r and s are each independently an integer of 0 to 3.

Preferably, $X^2$ is a group selected from the following groups.

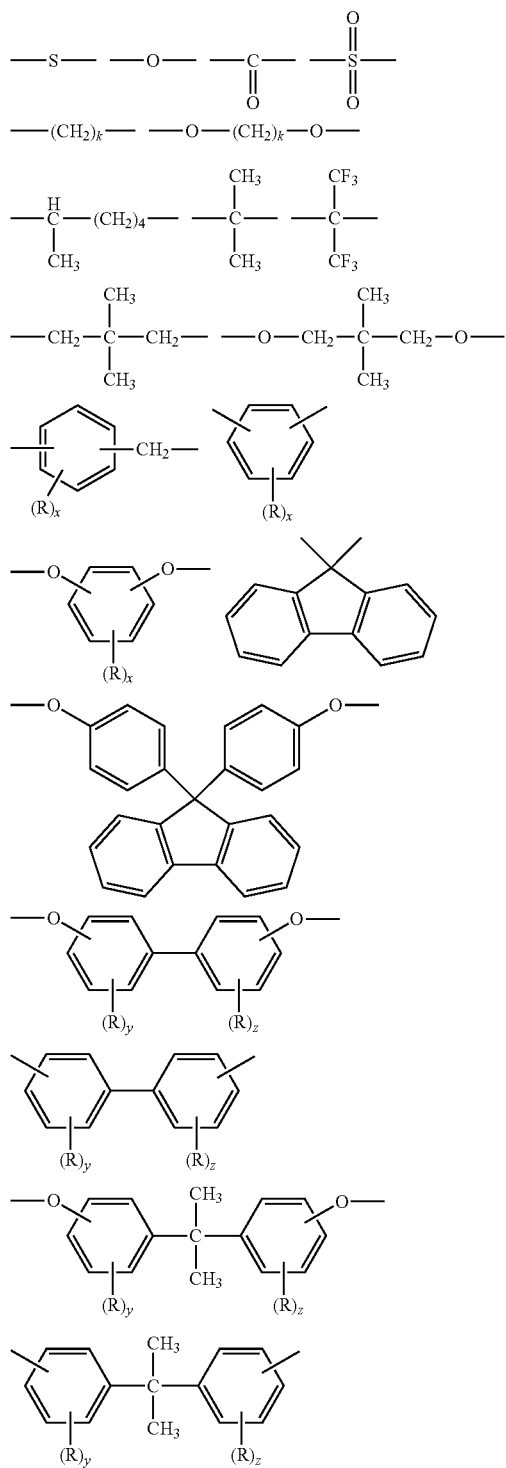
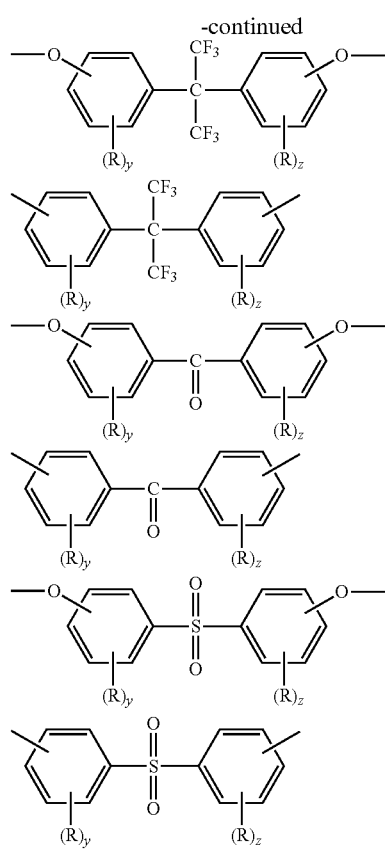

Herein R is each independently halogen, or a straight, branched or cyclic $C_1$-$C_8$ alkyl or haloalkyl group, k is an integer of 1 to 6, x is an integer of 0 to 4, and y and z are each independently an integer of 0 to 4.

The photosensitive resin composition may further comprise (C) a crosslinker. Preferably, the crosslinker is at least one compound selected from the group consisting of an amino condensate modified with formaldehyde or formaldehyde-alcohol, a phenol compound having on the average at least two methylol or alkoxymethylol groups in the molecule, and an epoxy compound having on the average at least two epoxy groups in the molecule.

The photosensitive resin composition may further comprise (E) a basic compound.

In one embodiment, the photosensitive resin composition is a substrate bonding material for bonding two substrates.

Also provided is a photosensitive resin coating comprising (A) the silicone-modified polybenzoxazole resin, and (B) a photoacid generator which is decomposed to generate an acid upon exposure to radiation of wavelength 190 to 500 nm.

In another aspect, the invention provides a photosensitive dry film comprising a support film and the photosensitive resin coating thereon.

In a further aspect, the invention provides a laminate comprising a substrate and the photosensitive resin coating thereon.

In a further aspect, the invention provides a pattern forming process comprising the steps of (i) coating the photosensitive resin composition defined above onto a substrate to form a photosensitive resin coating, (ii) exposing a predetermined region of the photosensitive resin coating to radiation through a photomask and post-exposure baking, and (iii) developing the exposed resin coating in a developer to dissolve away the unexposed region of the resin coating and to form a pattern of the resin coating.

In a further aspect, the invention provides a pattern forming process comprising the steps of (i) attaching the photosensitive dry film defined above at its photosensitive resin coating to a substrate, (ii) exposing a predetermined region of the photosensitive resin coating to radiation through a photomask and post-exposure baking, and (iii) developing the photosensitive resin coating as post-exposure baked in a developer to dissolve away the unexposed region of the resin coating and to form a pattern of the resin coating.

The pattern forming process may further include the step (iv) of post-curing the patterned coating resulting from development step (iii) at a temperature of 100 to 250° C.

Advantageous Effects of Invention

The photosensitive resin composition and the photosensitive dry film of the invention have many advantages of photosensitive material and can be readily processed in thick film form to define a fine size pattern. From the photosensitive resin composition, a photosensitive resin coating can be formed to a wide range of thickness. The resin coating is processed by the pattern forming process to form a fine size pattern having perpendicularity.

The resin coating obtained from the photosensitive resin composition or photosensitive dry film has improved film properties including resistance against chemicals, typically photoresist strippers, adhesion to substrates, electronic parts, semiconductor devices, and supports for circuit boards, mechanical properties, and electric insulation, and is thus fully reliable as an insulating protective film. The resin coating also has crack resistance and is thus useful as a protective film-forming material for electric and electronic

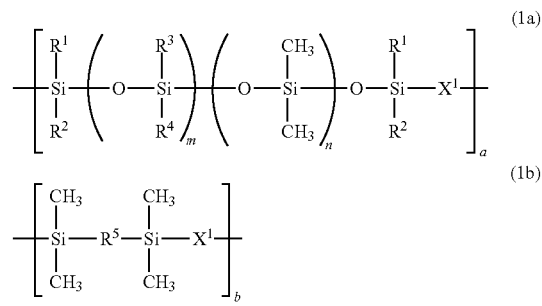

In formula (1a), $R^1$ to $R^4$ are each independently a $C_1$-$C_8$ monovalent hydrocarbon group which may contain a glycidyl, acryloyl or methacryloyl moiety. Suitable monovalent hydrocarbon groups include straight, branched or cyclic alkyl and aromatic groups.

Examples of the alkyl group include methyl, ethyl, n-propyl, isopropyl, cyclopropyl, n-butyl, isobutyl, sec-butyl, tert-butyl, cyclobutyl, n-pentyl, cyclopentyl, n-hexyl, cyclohexyl, n-heptyl, and n-octyl. Examples of the aromatic group include phenyl, benzyl, phenethyl, tolyl, and xylyl. Of these, $C_1$-$C_6$ alkyl and phenyl groups are preferred, with methyl and phenyl being more preferred.

In formula (1b), $R^5$ is a straight, branched or cyclic $C_1$-$C_8$ alkylene group or phenylene group. Examples of the alkylene group include methylene, ethylene, trimethylene, propylene, and tetramethylene. Of these, methylene and phenylene are preferred, with phenylene being more preferred.

The subscripts m and n are each independently an integer of 0 to 300, preferably 0 to 200, and more preferably 0 to 100. The subscripts a and b are positive numbers in the range: $0<a<1$, $0<b<1$, and $a+b=1$, preferably $0.05 \leq a \leq 0.8$ and $0.2 \leq b \leq 0.95$, more preferably $0.1 \leq a \leq 0.7$ and $0.3 \leq b \leq 0.9$.

In formulae (1a) and (1b), $X^1$ is a divalent linker having the formula (2).

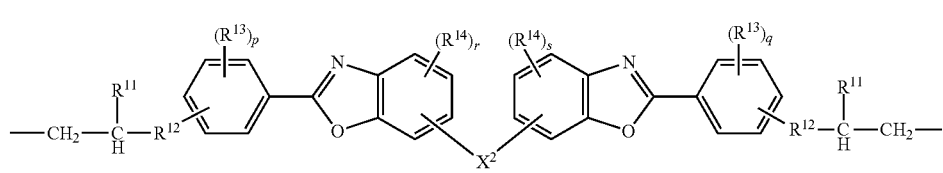

parts (such as circuit boards, semiconductor devices and display units) and a film-forming material for bonding substrates. The laminate obtained using the photosensitive resin composition or the photosensitive dry film has advantages including tenacious adhesion of resin coatings to substrates and improved flatness.

DESCRIPTION OF PREFERRED EMBODIMENT

As used herein, the notation (Cn-Cm) means a group containing from n to m carbon atoms per group.

Photosensitive Resin Composition (A) Silicone-Modified Polybenzoxazole Resin

One embodiment of the invention is a photosensitive resin composition comprising a silicone-modified polybenzoxazole resin comprising repeating units having the formula (1a) and repeating units having the formula (1b) as component (A).

In formula (2), $X^2$ is a single bond or divalent organic group. $R^{11}$ is each independently hydrogen or a $C_1$-$C_8$ monovalent hydrocarbon group in which one or more hydrogen atoms may be substituted by halogen atoms. $R^{12}$ is each independently a straight, branched or cyclic $C_1$-$C_8$ alkylene group in which any methylene moiety may be substituted by an ether bond or phenylene moiety. $R^{13}$ is each independently a hydroxyl or glycidyloxy group. $R^{14}$ is each independently a $C_1$-$C_8$ monovalent hydrocarbon group in which one or more hydrogen atoms may be substituted by halogen atoms.

Examples of the $C_1$-$C_8$ monovalent hydrocarbon group include straight, branched or cyclic alkyl and aromatic groups, with $C_1$-$C_6$ alkyl groups being preferred. The alkyl and aromatic groups are as exemplified above.

In formula (2), p and q are each independently an integer of 0 to 4, preferably 0 or 1; and r and s are each independently an integer of 0 to 3, preferably 0.

The divalent organic group represented by $X^2$ is preferably selected from the following groups.

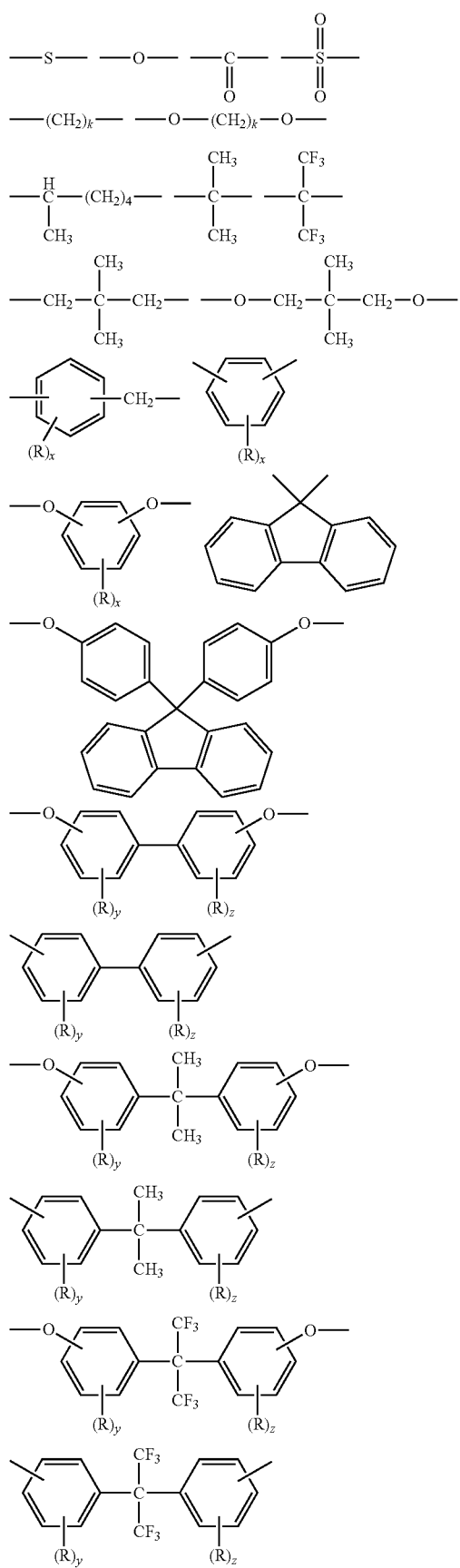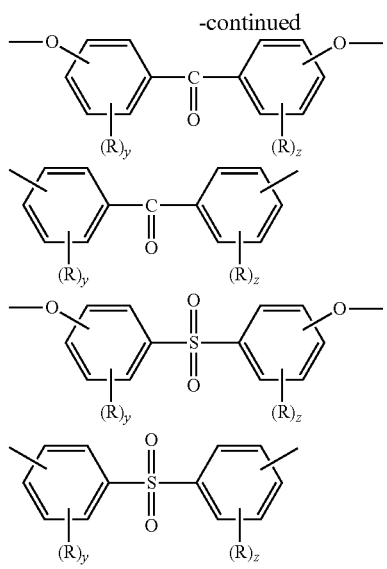
Herein R is each independently halogen, or a straight, branched or cyclic $C_1$-$C_8$ alkyl or haloalkyl group, k is an integer of 1 to 6, x is an integer of 0 to 4, preferably 0 to 2, and y and z are each independently an integer of 0 to 4, preferably 0 to 2.
Of these, the following groups are more preferred as $X^2$.
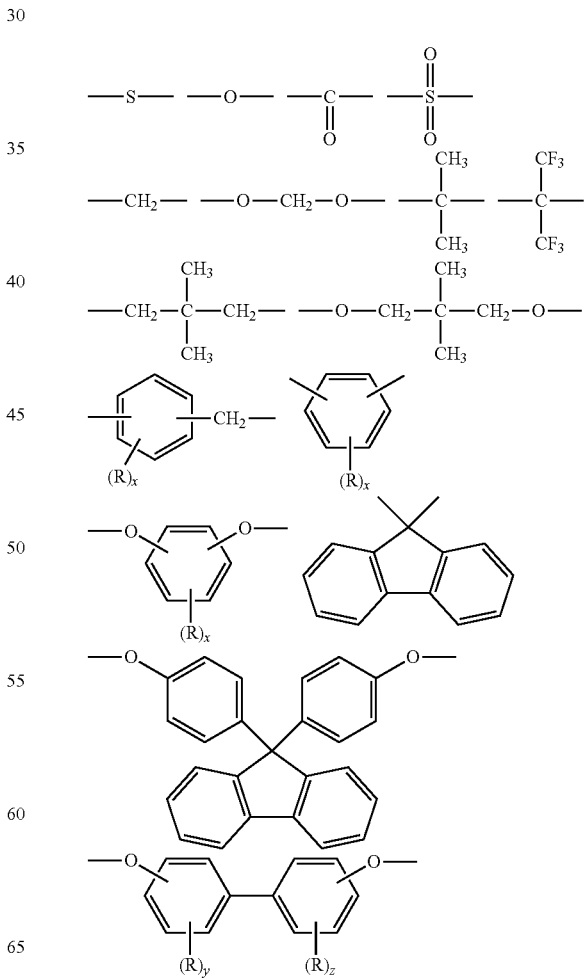

9
-continued
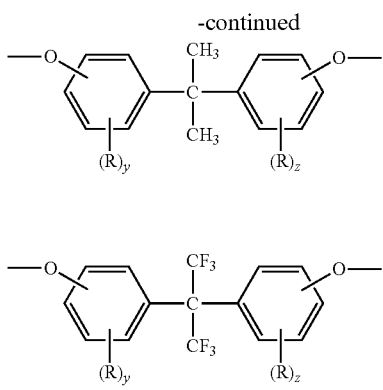
10
-continued
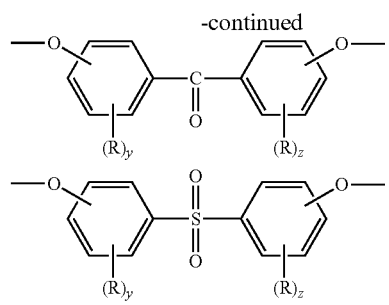
Herein R, x, y and z are as defined above.
Examples of the linker $X^1$ include the following groups, but are not limited thereto.
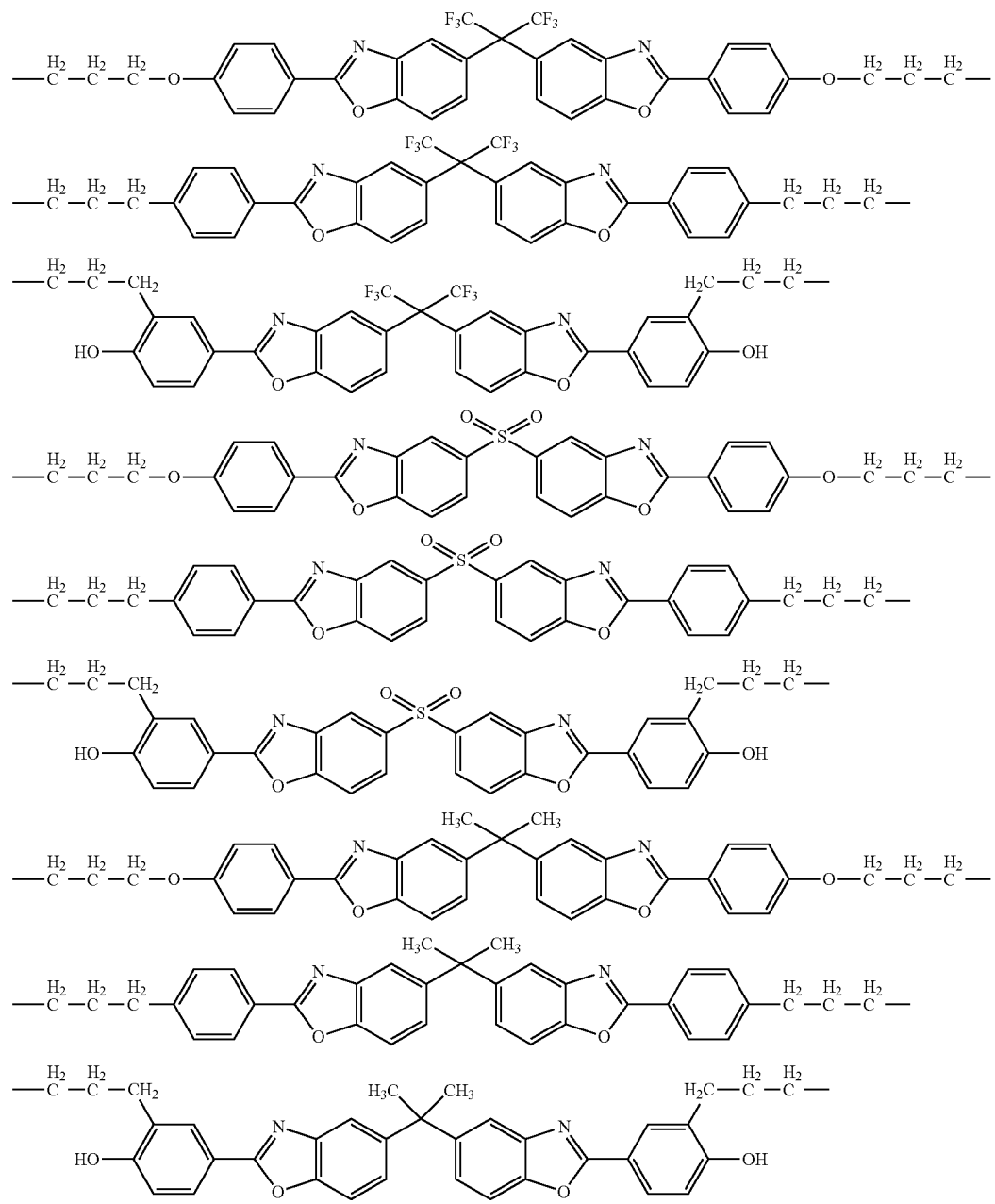

The silicone-modified polybenzoxazole resin may be a random or block copolymer. The polybenzoxazole resin has a silicone (or siloxane unit) content of preferably 30 to 80% by weight.

The silicone-modified polybenzoxazole resin preferably has a weight average molecular weight (Mw) of 3,000 to 500,000, more preferably 5,000 to 200,000. It is noted throughout the disclosure that Mw is measured by gel permeation chromatography (GPC) versus polystyrene standards using tetrahydrofuran as the elute.

In the photosensitive resin composition, component (A) exerts a sufficient film-forming function. A resin coating obtained from the photosensitive resin composition has improved adhesion to substrates and laminates, a pattern forming ability, crack resistance, and heat resistance. Notably, the silicone-modified polybenzoxazole resin has crosslinking groups such as epoxy and hydroxyl groups or crosslinking reaction-susceptible reactive sites in the molecule.

Method of Preparing Silicone-Modified Polybenzoxazole Resin

The silicone-modified polybenzoxazole resin may be prepared by addition polymerization of an organopolysiloxane having the formula (1-A), a compound having the formula (1-B), and a benzoxazole compound having the formula (2-A), shown below.

In the addition polymerization, a solvent may be used, if desired. Suitable solvents are hydrocarbon solvents such as toluene and xylene. The reaction temperature is preferably in a range of 40 to 150° C., more preferably 60 to 120° C., within which the catalyst is not deactivated and the polymerization can be completed within a short time. The polymerization time varies with the type and amount of the resulting resin. It is preferably about 0.5 to about 100 hours, more preferably about 0.5 to about 30 hours for preventing moisture entry into the polymerization system. After the completion of reaction, the solvent (if used) is distilled off, whereupon the silicone-modified polybenzoxazole resin is obtained.

The reaction procedure is not particularly limited. The preferred procedure is by first adding a compound having formula (2-A) to a solvent, heating, adding a metal catalyst to the mixture, and then adding compounds having formulae (1-A) and (1-B) dropwise over 0.1 to 5 hours.

In the addition polymerization, the reactants are preferably combined in such amounts that a molar ratio of the total amount of hydrosilyl groups in the compounds having formulae (1-A) and (1-B) to the total amount of alkenyl groups in the compound having formula (2-A) may range from 0.67 to 1.67, more preferably from 0.83 to 1.25. The Mw of the resulting resin can be controlled using a molecu-

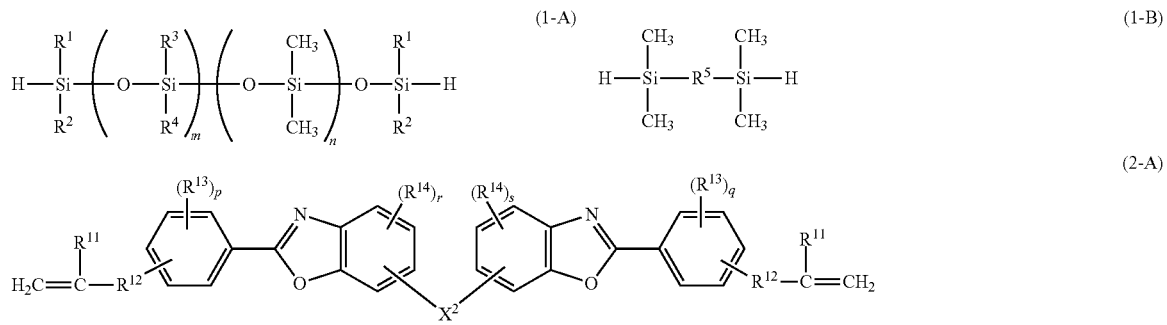

Herein $R^1$ to $R^5$, $R^{11}$ to $R^{14}$, $X^2$, m, n, p, q, r and s are as defined above.

The addition polymerization reaction is preferably performed in the presence of a metal catalyst. Examples of the catalyst used include platinum group metals alone such as platinum (including platinum black), rhodium and palladium; platinum chlorides, chloroplatinic acids and chloroplatinates such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$ and $Na_2HPtCl_4 \cdot xH_2O$, wherein x is preferably an integer of 0 to 6, more preferably 0 or 6; alcohol-modified chloroplatinic acids as described in U.S. Pat. No. 3,220,972; chloroplatinic acid-olefin complexes as described in U.S. Pat. Nos. 3,159,601, 3,159,662 and 3,775,452; supported catalysts comprising platinum group metals such as platinum black and palladium on supports of alumina, silica and carbon; rhodium-olefin complexes; chlorotris(triphenylphosphine)rhodium (known as Wilkinson's catalyst); and complexes of platinum chlorides, chloroplatinic acids and chloroplatinates with vinyl-containing siloxanes, specifically vinyl-containing cyclosiloxanes.

The catalyst is used in a catalytic amount, which is preferably 0.001 to 0.1% by weight, more preferably 0.01 to 0.1% by weight of platinum group metal based on the total weight of the compounds (exclusive of the solvent) used in the addition polymerization.

lar weight control agent such as a monoallyl compound (e.g., o-allylphenol), monohydrosilane (e.g., triethylhydrosilane) or monohydrosiloxane.

The benzoxazole compound having formula (2-A) may be obtained from oxazine ring synthesis by reacting a compound having the formula (2-B), a compound having the formula (2-C), and a compound having the formula (2-D) shown below.

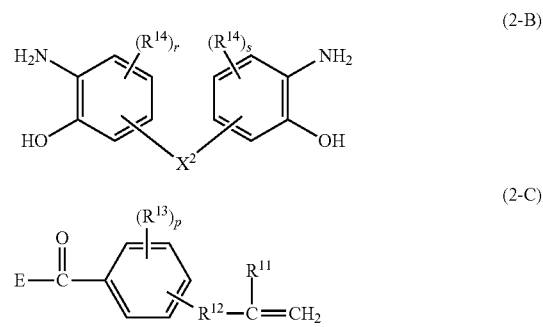

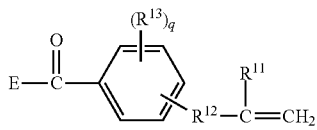
(2-D)

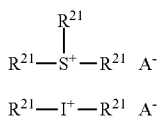
(3)

(4)

In formulae (2-B) to (2-D), $R^{11}$ to $R^{14}$, $X^2$, p, q, r and s are as defined above and E is a leaving group selected from a hydrogen atom, hydroxyl group, halogen atom, a straight, branched or cyclic $C_1$-$C_8$ alkoxy group, and phenoxy group. The preferred leaving group is hydroxyl or phenoxy because the high leaving ability helps the reaction to be completed within a short time.

The reaction is performed in a solvent, if necessary. Suitable solvents include N-methyl-2-pyrrolidone, amide solvents, lactones, carbonates, esters, ethers, ketones, alcohols, urea solvents, sulfoxide solvents, sulfone solvents, and hydrocarbon solvents.

If necessary, a reaction accelerator such as polyphosphoric acid or carbodiimide may be used. In case the double bond can undergo cationic polymerization with the aid of acid, a polymerization inhibitor or the like may also be added.

The reaction temperature is preferably in a range of about 100 to about 250° C., more preferably about 150 to about 230° C., within which the reactants and product are not decomposed, and the reaction can be completed in high yields and within a short time. The reaction time varies with the type and amount of the target compound. A time of about 0.5 to about 100 hours, especially about 0.5 to about 30 hours is preferred for preventing moisture entry into the reaction system.

In the above reaction, the reactants are preferably combined in such amounts that the total amount of the compounds having formulae (2-C) and (2-D) may range from 2 to 3 moles, more preferably from 2 to 2.3 moles per mole of the compound having formula (2-B). The amounts of the compounds having formulae (2-C) and (2-D) used may be determined as appropriate depending on the target benzoxazole compound. It is also preferred for ease of preparation that the compounds having formulae (2-C) and (2-D) be identical.

The organopolysiloxane having formula (1-A) and the compound having formula (1-B) may be synthesized by conventional well-known methods or available as commercial products.

(B) Photoacid Generator

The photosensitive resin composition of the invention also comprises a photoacid generator (PAG) as component (B). The PAG is typically a compound which is decomposed to generate an acid upon exposure to light with a wavelength of 190 to 500 nm, the generated acid serving as a curing catalyst. Since the photosensitive resin composition of the invention is highly compatible with the PAG, the PAG may be selected from a wide variety of such compounds. Typical PAGs include onium salts, diazomethane derivatives, glyoxime derivatives, β-ketosulfone derivatives, disulfone derivatives, nitrobenzyl sulfonate derivatives, sulfonic acid ester derivatives, imido-yl sulfonate derivatives, oxime sulfonate derivatives, and imino sulfonate derivatives.

Suitable onium salts include sulfonium salts having the following formula (3) and iodonium salts having the following formula (4).

In formulae (3) and (4), $R^{21}$ is each independently a straight, branched or cyclic $C_1$-$C_{12}$ alkyl group, $C_6$-$C_{12}$ aryl group, or $C_7$-$C_{12}$ aralkyl group, which may have a substituent. $A^-$ is a non-nucleophilic counter-ion.

Examples of alkyl groups include methyl, ethyl, propyl, butyl, cyclohexyl, norbornyl, and adamantyl. Exemplary aryl groups include phenyl, naphthyl and biphenylyl.

Exemplary aralkyl groups include benzyl and phenethyl. Examples of the substituent include oxo, straight, branched or cyclic $C_1$-$C_{12}$ alkoxy groups, straight, branched or cyclic $C_1$-$C_{12}$, alkyl groups, $C_6$-$C_{24}$ aryl groups, $C_7$-$C_{25}$ aralkyl groups, $C_6$-$C_{24}$ aryloxy groups, and $C_6$-$C_{24}$ arylthio groups.

Preferably $R^{21}$ is selected from optionally substituted alkyl groups such as methyl, ethyl, propyl, butyl, cyclohexyl, norbornyl, adamantyl, 2-oxocyclohexyl; optionally substituted aryl groups such as phenyl, naphthyl, biphenylyl, o-, m- or p-methoxyphenyl, ethoxyphenyl, m- or p-tert-butoxyphenyl, 2-, 3- or 4-methylphenyl, ethylphenyl, 4-tert-butylphenyl, 4-butylphenyl, dimethylphenyl, terphenylyl, biphenylyloxyphenyl, and biphenylylthiophenyl; and optionally substituted aralkyl groups such as benzyl and phenethyl. Inter alia, optionally substituted aryl groups and optionally substituted aralkyl groups are more preferred.

Examples of the non-nucleophilic counter-ion represented by $A^-$ include halide ions such as chloride and bromide; fluoroalkanesulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; fluoroalkanesulfonimide ions such as trifluoromethanesulfonimide; and fluoroalkanesulfonylmethide ions such as tris(trifluoromethanesulfonyl)methide.

Exemplary diazomethane derivatives are compounds of the following formula (5).

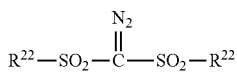
(5)

In formula (5), $R^{22}$ is each independently a straight, branched or cyclic $C_1$-$C_{12}$ alkyl or haloalkyl group, optionally substituted $C_6$-$C_{12}$ aryl group, or $C_7$-$C_{12}$ aralkyl group.

Examples of the alkyl group include methyl, ethyl, n-propyl, isopropyl, cyclopropyl, n-butyl, isobutyl, sec-butyl, tert-butyl, cyclobutyl, n-pentyl, cyclopentyl, cyclohexyl, norbornyl, and adamantyl. Exemplary haloalkyl groups include trifluoromethyl, 1,1,1-trifluoroethyl, 1,1,1-trichloroethyl, and nonafluorobutyl.

Examples of the optionally substituted aryl groups include phenyl; alkoxyphenyl groups such as o-, m- or p-methoxyphenyl, ethoxyphenyl, m- or p-tert-butoxyphenyl; alkylphenyl groups such as 2-, 3- or 4-methylphenyl, ethylphenyl, 4-tert-butylphenyl, 4-butylphenyl, and dimethylphenyl; and haloaryl groups such as fluorophenyl, chlorophenyl, and 1,2,3,4,5-pentafluorophenyl. Exemplary aralkyl groups include benzyl and phenethyl.

Exemplary onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, diphenyl(4-thiophenoxyphenyl)sulfonium hexafluoroantimonate, [4-(4-biphenylylthio)phenyl]-4-biphenylylphenylsulfonium tris(trifluoromethanesulfonyl)-methide.

Exemplary diazomethane derivatives include bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyOdiazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-pentylsulfonyl)diazomethane, bis(isopentylsulfonyl)diazomethane, bis(sec-pentylsulfonyl)diazomethane, bis(tert-pentylsulfonyl)diazomethane, 1-cyclohexylsulfonyl-1-(tert-butylsulfonyl)diazomethane, 1-cyclohexylsulfonyl-1-(tert-pentylsulfonyl)diazomethane, and 1-tert-pentylsulfonyl-1-(tert-butylsulfonyl)diazomethane.

Exemplary glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Exemplary β-ketosulfone derivatives include 2-cyclohexylcarbonyl-2-(p-toluenesulfonyl)propane and 2-isopropylcarbonyl-2-(p-toluenesulfonyl)propane.

Exemplary disulfone derivatives include diphenyl disulfone and dicyclohexyl disulfone.

Exemplary nitrobenzyl sulfonate derivatives include 2,6-dinitrobenzyl p-toluenesulfonate and 2,4-dinitrobenzyl p-toluenesulfonate;

Exemplary sulfonic acid ester derivatives include 1,2,3-tris(methanesulfonyloxy)benzene, 1,2,3-tris(trifluoromethanesulfonyloxy)benzene, and 1,2,3-tris(p-toluenesulfonyloxy)benzene.

Exemplary imido-yl sulfonate derivatives include phthalimidoyl triflate, phthalimidoyl tosylate, 5-norbornene-2,3-dicarboxyimidoyl triflate, 5-norbornene-2,3-dicarboxyimidoyl tosylate, 5-norbornene-2,3-dicarboxyimidoyl n-butylsulfonate, and N-trifluoromethylsulfonyloxynaphthylimide.

Typical of the oxime sulfonate derivative is α-(benzenesulfoniumoxyimino)-4-methylphenylacetonitrile.

Also included are iminosulfonate derivatives such as (5-(4-methylphenyl)sulfonyloxyimino-5H-thiophen-2-ylidene)-(2-methylphenyl)-acetonitrile and (5-(4-(4-methylphenylsulfonyloxy)phenylsulfonyloxyimino)-5H-thiophen-2-ylidene)-(2-methylphenyl)acetonitrile, as well as 2-methyl-2[(4-methylphenyl)sulfonyl]-1-[(4-methylthio)phenyl]-1-propane.

As the PAG, the above-exemplified onium salts are preferred, and the above-exemplified sulfonium salts are more preferred.

From the standpoint of photo-cure, the PAG (B) is preferably used in an amount of 0.05 to 20 parts by weight, and more preferably 0.05 to 5 parts by weight per 100 parts by weight of component (A). When the amount of the PAG is at least 0.05 part, it may generate a sufficient amount of acid for crosslinking reaction to proceed. As long as the amount of the PAG is up to 20 parts, any increase of the light absorption by the PAG itself is prevented and a lowering of transparency is avoided. The PAGs may be used alone or in admixture of two or more.

(C) Crosslinker

The photosensitive resin composition may further comprise (C) a crosslinker. The crosslinker undergoes condensation reaction with $R^{13}$ in formula (2) in component (A) to facilitate pattern formation and to increase the strength of a resin coating after photo-cure.

The preferred crosslinker is a resin having a weight average molecular weight (Mw) of 150 to 10,000, more preferably 200 to 3,000. A Mw of at least 150 ensures sufficient photo-cure whereas a Mw of up to 10,000 eliminates the risk of exacerbating the heat resistance of the composition after photo-cure. Suitable resins include phenolic resins, epoxy resins and alkoxy-containing resins.

Preferably, the crosslinker is selected from amino condensates modified with formaldehyde or formaldehyde-alcohol, phenol compounds having on the average at least two methylol or alkoxymethylol groups in the molecule, and epoxy compounds having on the average at least two epoxy groups in the molecule. These compounds may be used alone or in admixture.

Examples of the amino condensate modified with formaldehyde or formaldehyde-alcohol include melamine condensates modified with formaldehyde or formaldehyde-alcohol, and urea condensates modified with formaldehyde or formaldehyde-alcohol.

The modified melamine condensates are obtained, for example, by effecting addition polycondensation of a modified melamine having the formula (6) or an oligomer (e.g., dimer or trimer) thereof with formaldehyde until a desired molecular weight is reached.

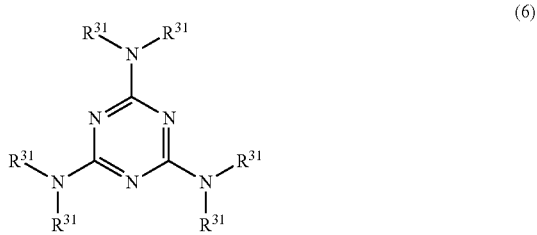

(6)

In formula (6), $R^{31}$ is each independently a methylol group, $C_2$-$C_5$ alkoxymethyl group or hydrogen, and at least one $R^{31}$ is a methylol or alkoxymethyl group. Exemplary alkoxymethyl groups include methoxymethyl and ethoxymethyl.

Illustrative, non-limiting, examples of the modified melamine having formula (6) include trimethoxymethylmonomethylolmelamine, dimethoxymethylmonomethylolmelamine, trimethylolmelamine, hexamethylolmelamine, and hexamethoxymethylolmelamine.

The modified melamine having formula (6) is prepared, for example, by modifying a melamine monomer with formaldehyde into a methylol form in a well-known manner, and optionally, further modifying it with an alcohol into an alkoxy form. The alcohols used herein are lower alcohols, for example, alcohols having 1 to 4 carbon atoms.

The addition polycondensation may be performed by any well-known methods. The modified melamine having formula (6) may be used alone or in admixture.

Examples of the urea condensate modified with formaldehyde or formaldehyde-alcohol include methoxymethylated urea condensates, ethoxymethylated urea condensates, and propoxymethylated urea condensates.

The modified urea condensates are prepared, for example, by modifying a urea condensate having a desired molecular weight with formaldehyde into a methylol form in a well-known manner, and optionally, further modifying it with an alcohol into an alkoxy form.

Examples of the phenol compound having on the average at least two methylol or alkoxymethylol groups in a molecule include (2-hydroxy-5-methyl)-1,3-benzenedimethanol and 2,2',6,6'-tetramethoxymethylbisphenol A.

Examples of the epoxy compound having at least two epoxy groups include bisphenol epoxy resins such as bisphenol A epoxy resins and bisphenol F epoxy resins, novolak epoxy resins such as phenol novolak epoxy resins and cresol novolak epoxy resins, triphenol alkane epoxy resins, biphenyl epoxy resins, dicyclopentadiene-modified phenol novolak epoxy resins, phenol aralkyl epoxy resins, biphenyl aralkyl epoxy resins, naphthalene ring-containing epoxy resins, glycidyl ester epoxy resins, cycloaliphatic epoxy resins, and heterocyclic epoxy resins.

The crosslinker (C) may be used in an amount of 0 to 100 parts, preferably 0.5 to 50 parts, and more preferably 1 to 30 parts by weight per 100 parts by weight of component (A). At least 0.5 part of component (C) ensures sufficient cure upon light exposure. As long as the amount of component (C) is up to 100 parts, the proportion of component (A) in the resin composition is not reduced, allowing the cured composition to exert its effects to the full extent. Component (C) may be used alone or in admixture.

(D) Solvent

The photosensitive resin composition may further comprise a solvent as component (D). The solvent used herein is not particularly limited as long as the foregoing components, and component (E) and additives to be described later are soluble. When a solvent is used, the resin composition is improved in coating properties.

Preferred are organic solvents in which the foregoing components are fully soluble. Illustrative, non-limiting, examples of the organic solvent include ketones such as cyclohexanone, cyclopentanone and methyl-2-n-pentylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, and γ-butyrolactone. These solvents may be used alone or in admixture. Of these solvents, preferred are ethyl lactate, cyclohexanone, cyclopentanone, PGMEA, γ-butyrolactone, and mixtures thereof, in which the PAG is most soluble.

The solvent (D) may be used in an amount of 0 to 5,000 parts by weight per 100 parts by weight of components (A) and (B) combined. From the standpoints of compatibility and viscosity of the resin composition, the amount of the solvent (D) used is preferably 50 to 2,000 parts, more preferably 50 to 1,000 parts, and even more preferably 50 to 100 parts by weight.

(E) Basic Compound

The photosensitive resin composition may further contain a basic compound as component (E). The basic compound used herein is preferably a compound capable of suppressing the rate of diffusion when the acid generated by the PAG diffuses within the resin coating. The inclusion of the basic compound improves resolution, suppresses changes in sensitivity following exposure and reduces substrate and environment dependence, as well as improving the exposure latitude and the pattern profile.

Examples of the basic compound include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, and imide derivatives.

Suitable primary aliphatic amines include ammonia, methylamine, ethylamine, n-propylamine, isopropylamine, n-butylamine, isobutylamine, sec-butylamine, tert-butylamine, pentylamine, tert-pentylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

Suitable tertiary aliphatic amines include trimethylamine, triethylamine, tri-n-propylamine, triisopropylamine, tri-n- butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Suitable mixed amines include dime thylethylamine, methylethylpropylamine, benzylamine, phenethylamine, and benzyldimethylamine.

Examples of the aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, to diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Suitable nitrogen-containing compounds with carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Suitable nitrogen-containing compounds with sulfonyl group include 3-pyridinesulfonic acid and pyridinium p-toluenesulfonate.

Examples of suitable nitrogen-containing compounds with hydroxyl group, nitrogen-containing compounds with hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl) isonicotinamide.

Suitable amide derivatives include formamide, N-methylformamide, N,N-dimethylformamide, acetamide, N-methylacetamide, N,N-dimethylacetamide, propionamide, and benzamide.

Suitable imide derivatives include phthalimide, succinimide, and maleimide.

Basic compounds having the formula (7) are also useful.

$$(R^{41})_w—N—(R^{42})_{3-w} \quad (7)$$

In formula (7), w is 1, 2 or 3. $R^{41}$ is independently selected from substituent groups of the following formulae (8) to (10). $R^{42}$ is independently hydrogen or a straight, branched or cyclic $C_1$-$C_{20}$ alkyl group which may contain an ether bond or hydroxyl group. When at least two groups $R^{41}$ are included, two groups $R^{41}$ may bond together to form a ring with the nitrogen atom. Also when at least two groups $R^{41}$ are included, they may be identical or different. When at least two groups $R^{42}$ are included, they may be identical or different.

$$—R^{43}—O—R^{44} \quad (8)$$

$$—R^{45}—O—R^{46}—\overset{O}{\underset{\|}{C}}—R^{47} \quad (9)$$

$$—R^{48}—\overset{O}{\underset{\|}{C}}—O—R^{49} \quad (10)$$

In formulae (8) to (10), $R^{43}$, $R^{45}$ and $R^{48}$ are each independently a straight or branched $C_1$-$C_4$ alkylene group. $R^{44}$ and $R^{47}$ are each independently hydrogen or a straight, branched or cyclic $C_1$-$C_{20}$ alkyl group which may contain at least one hydroxyl moiety, ether bond, ester bond and/or lactone ring. $R^{46}$ is a single bond or a straight or branched $C_1$-$C_4$ alkylene group. $R^{49}$ is a straight, branched or cyclic $C_1$-$C_{20}$ alkyl group which may contain at least one hydroxyl moiety, ether bond, ester bond and/or lactone ring.

Examples of the compound having formula (7) include, but are not limited to, tris[2-(methoxymethoxy)ethyl]amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tertbutoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxyethyl)bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis(methoxycarbonylmethyl)amine, N-hexylbis(methoxycarbonylmethyl)amine, and 13-(diethylamino)-6-valerolactone.

The basic compounds may be used alone or in admixture of two or more. The basic compound (E) may be formulated in an amount of 0 to 3 parts by weight per 100 parts by weight of component (A). From the standpoint of sensitivity, the amount of the basic compound is preferably 0.01 to 2 parts, more preferably 0.05 to 1 part by weight.

Other Additives

Besides the aforementioned components, the photosensitive resin composition may include optional additives. A typical additive is a surfactant which is commonly used for improving the coating characteristics.

Preferred surfactants are nonionic surfactants, for example, fluorochemical surfactants such as perfluoroalkyl polyoxyethylene ethanols, fluorinated alkyl esters, perfluoroalkylamine oxides, and fluorinated organosiloxane compounds. These surfactants are commercially available. Illustrative examples include Fluorad® FC-430 from 3M, Surflon® S-141 and S-145 from AGC Seimi Chemical Co., Ltd., Unidyne® DS-401, DS-4031, and DS-451 from Daikin Industries Ltd., Megaface® F-8151 from DIC Corp., and X-70-093 from Shin-Etsu Chemical Co., Ltd. Preferred surfactants are Fluorad FC-430 and X-70-093. The surfactant is preferably used in an amount of 0.05 to 1 part by weight per 100 parts by weight of component (A).

The photosensitive resin composition may contain a silane coupling agent, which is effective for further increasing the adhesion of a resin coating of the resin composition to an adherend. Suitable silane coupling agents include epoxy-containing silane coupling agents and aromatic group-containing aminosilane coupling agents. The silane coupling agent may be used alone or in admixture. Although the amount of the silane coupling agent used is not particularly limited, it is preferably 0.01 to 5% by weight of the resin composition.

The photosensitive resin composition of the invention is prepared in any desired way. For example, it may be prepared by agitating and mixing the aforementioned components and optionally passing the mixture through a filter.

The photosensitive resin composition is advantageously used, for example, as resist material for photolithography, film-forming material for semiconductor device protective film, interconnection protective film, coverlay film, solder mask, and TSV dielectric film, and adhesive between substrates in three-dimensional laminates.

Pattern Forming Process Using Photosensitive Resin Composition

Another embodiment of the invention is a pattern forming process comprising the steps of:
(i) coating the photosensitive resin composition onto a substrate to form a photosensitive resin coating,
(ii) exposing a predetermined region of the photosensitive resin coating to radiation through a photomask and post-exposure baking, and
(iii) developing the exposed resin coating in a developer to dissolve away the unexposed region of the resin coating and to form a pattern of the resin coating.

First, in step (i), the photosensitive resin composition is coated onto a substrate to form a photosensitive resin coating thereon. Examples of the substrate include silicon wafers, TSV silicon wafers, silicon wafers which have been thinned by back side polishing, plastic substrates, ceramic substrates, and substrates having a metal coating of Ni or Au wholly or partly on the surface by ion sputtering or plating. Also useful are substrates having grooves and/or holes having an opening width of 10 to 100 µm and a depth of 10 to 120 µm.

The coating technique may be dipping, spin coating, roll coating or the like. The coating weight may be selected as appropriate for a particular purpose, preferably so as to form a photosensitive resin coating having a thickness of 0.1 to 200 µm, more preferably 1 to 150 µm. A pre-wetting technique of dispensing a solvent dropwise on a substrate prior to coating of the resin composition may be employed for the purpose of making the coating thickness on the substrate more uniform. The type and amount of the solvent dispensed dropwise may be selected for a particular purpose. For example, alcohols such as isopropyl alcohol (IPA), ketones such as cyclohexanone, and glycols such as propylene glycol monomethyl ether are preferred. The solvent used in the photosensitive resin composition may also be used.

At this point, the coating may be prebaked to volatilize off the solvent and the like, if necessary, for efficient photo-cure reaction. Prebake may be performed, for example, at 40 to 140° C. for 1 minute to about 1 hour.

Next, in step (ii), a predetermined region of the photosensitive resin coating is exposed to radiation through a photomask. The exposure radiation is generally of wavelength 10 to 600 nm, preferably 190 to 500 nm. The photomask used herein may be, for example, one perforated with a desired pattern. Although the material of the photomask is not particularly limited, a material capable of shielding radiation in the above wavelength range, typically chromium is preferred. Examples of the radiation in the above wavelength range include radiation of various wavelengths from radiation-emitting units, specifically UV radiation such as g-line, h-line or i-line, and deep UV (248 nm, 193 nm). Among these, radiation of wavelength 248 to 436 nm is preferred. An appropriate exposure dose is 10 to 10,000 mJ/cm$^2$.

The next step may be post-exposure bake (PEB) which is effective for enhancing development sensitivity. PEB is preferably performed at 40 to 150° C. for 0.5 to 10 minutes. The exposed region of the resin coating is crosslinked by PEB to form an insolubilized pattern which is insoluble in an organic solvent as developer.

PEB is followed by the step (iii) of developing the exposed resin coating in a developer to dissolve away the unexposed region of the resin coating and to form a pattern of the resin coating. The preferred developers are organic solvents including alcohols such as IPA, ketones such as cyclohexanone, and glycols such as propylene glycol monomethyl ether. The solvent used in the photosensitive resin composition is also useful. Development is effected in a conventional manner, for example, by dipping the exposed coating in the developer. The development is followed by washing, rinsing and drying if necessary. In this way, a resin coating having the desired pattern is obtained.

In step (iv), the patterned coating may be post-cured in an oven or hot plate at a temperature of preferably 100 to 250° C., more preferably 150 to 220° C. The photosensitive resin composition ensures that a resin coating having improved film properties is obtained from post-cure even at a relatively low temperature around 200° C. A post-cure temperature in the range of 100 to 250° C. is effective for increasing the crosslinking density of the resin coating and removing any residual volatile matter. The resulting coating has augmented adhesion to substrates, heat resistance, mechanical strength, good electric properties, and bond strength. An appropriate post-cure time is 10 minutes to 10 hours, more preferably 10 minutes to 3 hours. The resin coating as post-cured has a thickness of 1 to 200 µm, preferably 5 to 50 µm. Through these steps, there is obtained the resin coating suited for the final purpose of protecting electric and electronic parts.

Although the pattern forming process has been described, it is sometimes unnecessary to form a pattern. When it is simply desired to form a uniform film, for example, the same process as above may be followed except that in step (ii), the resin coating is exposed to radiation of suitable wavelength directly, i.e., without the photomask.

Substrate Bonding Method

The photosensitive resin composition may be used as an adhesive (or substrate bonding material) for bonding two substrates. The substrate bonding method may be a method of joining a first substrate having a coating of the resin composition formed thereon to a second substrate under a sufficient set of temperature and pressure conditions to form an adhesive bond between the substrates. One or both of the first substrate having a resin coating and the second substrate may have been cut into a chip such as by dicing. The preferred bonding conditions include a temperature of 50 to 200° C. and a time of 1 to 60 minutes. Any desired bonding units may be used, for example, a wafer bonder for bonding wafers under reduced pressure and under a certain load, or a flip chip bonder for performing chip-wafer or chip-chip bonding. The adhesive layer between substrates may be subjected to post-cure treatment into a permanent bond having augmented bond strength.

The thus joined or bonded substrates may be post-cured under the same conditions as in the above step (iv), for thereby increasing the crosslinking density of the resin coating to enhance substrate bonding force. It is noted that crosslinking reaction occurs by the heat during bonding. Since this crosslinking reaction is not accompanied with side reaction entailing degassing, no bonding voids are induced when the photosensitive resin composition is used as the substrate adhesive.

Photosensitive Dry Film

A further embodiment of the invention is a photosensitive dry film comprising a support film and the photosensitive resin coating thereon.

The photosensitive dry film (support film+resin coating) is solid, and the photosensitive resin coating contains no solvent. This eliminates the risk that bubbles resulting from volatilization of solvent are left within the resin coating and between the resin coating and the rugged substrate surface. An appropriate thickness range exists for the resin coating when planarity and step coverage on rugged substrate surface and a substrate lamination spacing are taken into account. It is preferred from the standpoints of planarity, step coverage, and substrate lamination spacing that the photosensitive resin coating have a thickness of 5 to 200 µm, more preferably 10 to 100 µm.

Furthermore, the viscosity and fluidity of the photosensitive resin coating are closely correlated. As long as the photosensitive resin coating has a proper range of viscosity, it exhibits a sufficient fluidity to fill deeply even in a narrow gap or it softens to enhance the adhesion to the substrate. Accordingly, from the standpoint of fluidity, the photosensitive resin coating should preferably have a viscosity in the range of 10 to 5,000 Pa·s, more preferably 30 to 2,000 Pa·s, and even more preferably 50 to 300 Pa·s at a temperature of 80 to 120° C. It is noted that the viscosity is measured by a rotational viscometer.

The photosensitive dry film has the advantage that when tightly attached to a substrate having asperities on its surface (e.g., a substrate having grooves and/or holes with an opening width of 10 to 100 µm and a depth of 10 to 120 µm), the photosensitive resin coating is coated so as to conform to the asperities, achieving high planarity. Particularly when the photosensitive resin coating is composed mainly of a silicone-modified polybenzoxazole resin as defined herein, higher planarity is achievable owing to the advantage of low surface tension. Further, if the photosensitive resin coating is in close contact with the substrate in a vacuum environment, generation of gaps therebetween is effectively inhibited.

The photosensitive dry film may be manufactured by coating the photosensitive resin composition to a support and drying the resin composition into a resin coating. An apparatus for manufacturing the photosensitive dry film may be a film coater commonly used in the manufacture of pressure-sensitive adhesive products. Suitable film coaters include, for example, a comma coater, comma reverse coater, multiple coater, die coater, lip coater, lip reverse coater, direct gravure coater, offset gravure coater, three roll bottom reverse coater, and four roll bottom reverse coater.

The support film is unwound from a supply roll in the film coater, passed across the head of the film coater where the photosensitive resin composition is coated onto the support film to the predetermined buildup, and then moved through a hot air circulating oven at a predetermined temperature for a predetermined time, where the photosensitive resin coating is dried on the support film. Thereafter, the support film having the photosensitive resin coating thereon and a protective film which is unwound from another supply roll in the film coater are passed across a laminate roll under a predetermined pressure whereby the protective film is bonded to the photosensitive resin coating on the support film, whereupon the laminate is wound up on a take-up shaft in the film coater. Preferably, the oven temperature is 25 to 150° C., the pass time is 1 to 100 minutes, and the bonding pressure is 0.01 to 5 MPa.

The support film used in the photosensitive dry film may be a single film or a multilayer film consisting of a plurality of stacked polymer layers. Examples of the film material include synthetic resins such as polyethylene, polypropylene, polycarbonate and polyethylene terephthalate (PET), with the PET film being preferred for appropriate flexibility, mechanical strength and heat resistance. These films may have been pretreated such as by corona treatment or coating of a release agent. Such films are commercially available, for example, Cerapeel® WZ(RX) and Cerapeel® BX8(R) from Toray Advanced Film Co., Ltd.; E7302 and E7304 from Toyobo Co., Ltd.; Purex® G31 and Purex® G71T1 from Teijin DuPont Films Japan Ltd.; and PET38×1-A3, PET38×1-V8 and PET38×1-X08 from Nippa Co., Ltd.

The protective film used in the photosensitive dry film may be similar to the support film. Among others, PET and polyethylene films having an appropriate flexibility are preferred. Such films are also commercially available. For example, PET films are as mentioned above, and polyethylene films include GF-8 from Tamapoly Co., Ltd. and PE film 0 type from Nippa Co., Ltd.

Both the support and protective films preferably have a thickness of 10 to 100 μm, more preferably 25 to 50 μm, for consistent manufacture of photosensitive dry film, and prevention of wrapping or curling on a take-up roll.

Pattern Forming Process Using Photosensitive Dry Film

A further embodiment of the invention is a pattern forming process comprising the steps of:
(i) attaching the photosensitive dry film at its photosensitive resin coating to a substrate,
(ii) exposing a predetermined region of the photosensitive resin coating to radiation through a photomask and post-exposure baking,
(iii) developing the photosensitive resin coating as post-exposure baked in a developer to dissolve away the unexposed region of the resin coating and to form a pattern of the resin coating.

In step (i), the photosensitive dry film at its photosensitive resin coating is attached to a substrate after stripping the protective film, if any, from the dry film. The dry film may be attached using a film attachment apparatus.

The substrate may be the same as used in the pattern forming process using the photosensitive resin composition.

The film attachment apparatus is preferably a vacuum laminator. The photosensitive dry film is mounted in the film attachment apparatus where the protective film is stripped from the dry film. In the vacuum chamber kept at a predetermined vacuum, the bare photosensitive resin coating of the dry film is closely bonded to the substrate on a table at a predetermined temperature, using a bonding roll under a predetermined pressure. Preferably, the temperature is 60 to 120° C., the pressure is 0 to 5.0 MPa, and the vacuum is 50 to 500 Pa.

The attachment of dry film may be repeated plural times, if necessary to obtain a photosensitive resin coating having the desired thickness. The attachment step is repeated 1 to 10 times, for example, before a photosensitive resin coating having a thickness of the order of 10 to 1,000 μm, preferably 100 to 500 μm is obtained.

The assembly of the photosensitive resin coating on the substrate may be prebaked, if necessary, for facilitating photo-cure reaction of the photosensitive resin coating or enhancing the adhesion between the resin coating and the substrate. Prebake may be, for example, at 40 to 140° C. for 1 minute to 1 hour. Like the pattern forming process using the photosensitive resin composition, the photosensitive resin coating attached to the substrate may be subjected to steps of (ii) exposing a predetermined region of the photosensitive resin coating to radiation through a photomask and PEB, (iii) developing the photosensitive resin coating after PEB in a developer to dissolve away the unexposed region of the resin coating and to form a pattern of the resin coating, and optionally (iv) post-curing the patterned coating at a temperature of 100 to 250° C. It is noted that the support film of the photosensitive dry film may be removed before prebake or before PEB, by mechanical stripping or the like, depending on a particular process.

The resin coating obtained from the photosensitive resin composition or photosensitive dry film has excellent properties including heat resistance, flexibility, electric insulation, mechanical properties, and substrate adhesion and is thus best suited as protective film for electric and electronic parts such as semiconductor devices and as substrate bonding film.

The pattern forming process using the photosensitive resin composition or photosensitive dry film is successful in readily forming a fine size pattern of thick film.

Laminate

A still further embodiment of the invention is a laminate comprising a substrate and a photosensitive resin coating formed thereon from the photosensitive resin composition or photosensitive dry film. The substrate may be a flat substrate as commonly used or a rugged substrate provided with grooves and/or holes having an opening width of 10 to 100 μm and a depth of 10 to 120 μm. The laminate is improved in adhesion between the substrate and the resin coating and provides high flatness even when the substrate is rugged.

EXAMPLE

Examples of the invention are given below by way of illustration and not by way of limitation. Notably, the weight average molecular weight (Mw) is measured by gel permeation chromatography (GPC) versus monodisperse polystyrene standards using GPC column TSKGEL Super HZM-H (Tosoh Corp.) under analytical conditions: flow rate 0.6 mL/min, tetrahydrofuran elute, and column temperature 40° C.

The compounds used in Examples and Comparative Examples are shown below. In the formulae, Ph stands for phenyl.

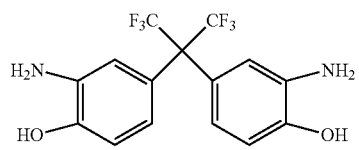
(A-1)
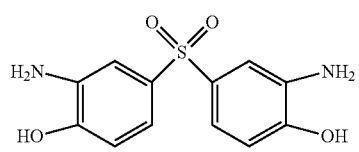
(B-1)
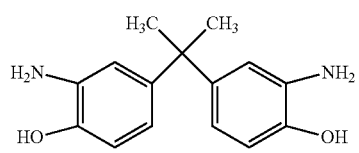
(C-1)
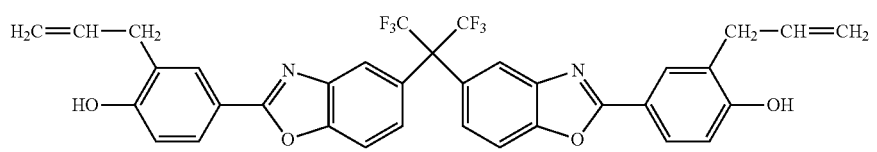
(S-1a)
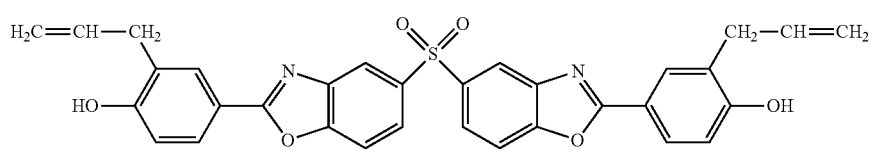
(S-1b)
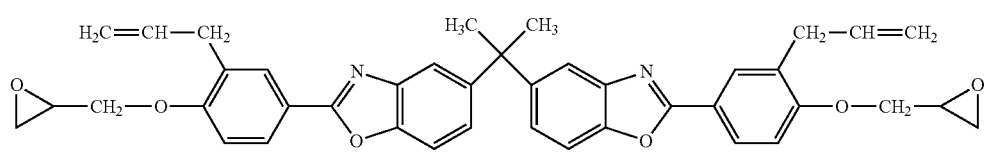
(S-1c)
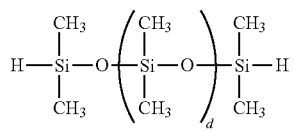
(S-2)
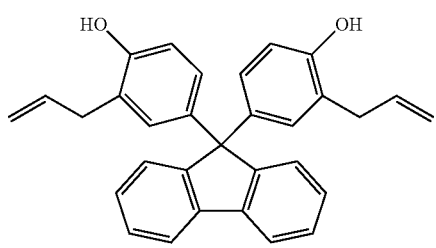
(A-2)
(B-2)
(C-2)
(S-3a)
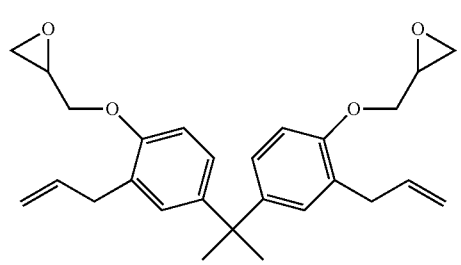
(S-3b)
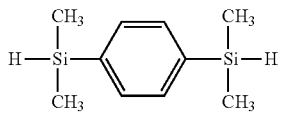
(S-4)

Synthesis of Benzoxazole Compounds

Synthesis Example 1

Synthesis of Benzoxazole Compound S-1a

In a 300-mL four-neck flask, 35.6 g (0.20 mol) of Compound A-2 was dissolved in 50 g of γ-butyrolactone under a nitrogen stream. To the flask, a solution of 41.2 g (0.20 mol) of dicyclohexylcarbodiimide in 50 g of γ-butyrolactone was added dropwise at 5° C. The contents were stirred for 20 minutes at the temperature of 5° C., after which a solution of 36.6 g (0.10 mol) of Compound A-1 in 50 g of γ-butyrolactone was added dropwise at 5° C. The contents were stirred at 5° C. for 3 hours, then at room temperature for a further 10 hours. At the end of stirring, the reaction system was heated at 200° C. whereupon ring-closing dehydration or cyclodehydration reaction was run for 20 hours. The cyclodehydration reaction was performed while removing water from the reaction system via a Dean-Stark trap. The reaction mixture was filtered to remove the by-product urea and recrystallized from isopropyl alcohol (pure water was added as a poor solvent). Finally the crystal was dried at 120° C. for 3 hours, obtaining 52.0 g of benzoxazole compound S-1a (yield 80.0%). The compound was analyzed by $^{1}$H-NMR and $^{13}$C-NMR (AV400M by Bruker Corp., solvent: toluene-$d_8$), with the data shown in Tables 1 and 2.

TABLE 1

| Peak | nH | Chem. Shifts/ppm |
| --- | --- | --- |
| a | 2 | 7.37-7.61 |
| b | 2 | 7.51-7.98 |
| c | 2 | 7.79-7.99 |
| d | 2 | 6.96-7.88 |
| e | 2 | 6.71-7.01 |
| f | 2 | 7.91-8.29 |
| g | 4 | 3.38-3.72 |
| h | 2 | 6.02-6.34 |
| i | 2 | 5.06-5.17 |
| j | 2 | 5.09-5.32 |
| k | 2 | 4.75-7.01 |

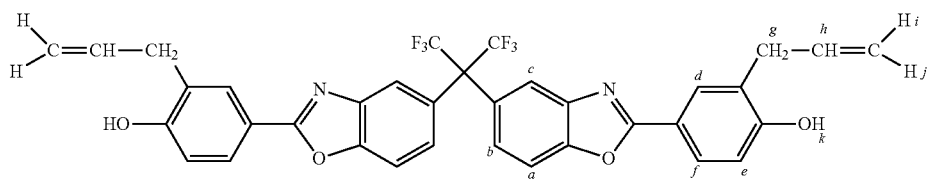 [SMILES: C=CCc1cc(-c2nc3cc(S(=O)(=O)c4ccc5oc(-c6ccc(O)c(CC=C)c6)nc5c4)ccc3o2)ccc1O]

TABLE 2

| Peak | CHn | Chem. Shifts/ppm |
| --- | --- | --- |
| 1 | C | 162.11 |
| 2 | C | 144.69 |
| 3 | C | 147.1 |
| 4 | CH | 111.73 |
| 5 | CH | 131.6 |
| 6 | C | 129.28 |
| 7 | CH | 122.1 |
| 8 | C | 121.57 |
| 9 | CH | 127.34 |
| 10 | C | 125.34 |
| 11 | C | 155.34 |
| 12 | CH | 115.41 |
| 13 | CH | 126.53 |
| 14 | C | 66.7 |
| 15 | C | 123.95 |
| 16 | CH2 | 35.6 |
| 17 | CH | 136.91 |
| 18 | CH2 | 115.85 |

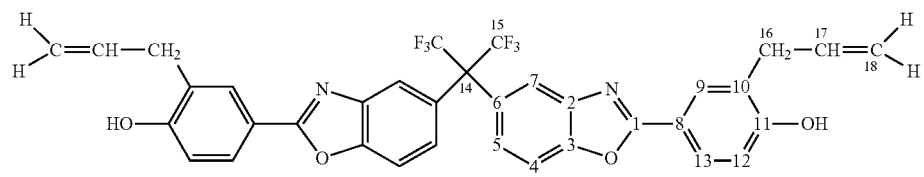

Synthesis Example 2

Synthesis of Benzoxazole Compound S-1b

In a 300-mL four-neck flask, 28.0 g (0.10 mol) of Compound B-1 and 50.8 g (0.20 mol) of Compound B-2 were dissolved in 100 g of N-methyl-2-pyrrolidone (NMP) under a nitrogen stream. The contents were heated at 180° C. for reaction while removing the by-product phenol from the reaction system under reduced pressure. After the reaction system was heated for 3 hours, it was restored to atmospheric pressure. It was then heated at 200° C. whereupon ring-closing dehydration or cyclodehydration reaction was run for 20 hours. The cyclodehydration reaction was performed while removing water from the reaction system via a Dean-Stark trap. The reaction solution was added to 1,000 mL of water for reprecipitation. The crystal precipitate was collected and washed with deionized water and methanol. Finally the crystal was dried at 120° C. for 3 hours, obtaining 44.5 g of benzoxazole compound S-1b (yield 78.9%). The $^1$H-NMR and $^{13}$C-NMR data are shown in Tables 3 and 4, respectively.

TABLE 3

| Peak | nH | Chem. Shifts/ppm |
|---|---|---|
| a | 2 | 7.24-7.90 |
| b | 2 | 7.70-8.05 |
| c | 2 | 7.98-8.56 |
| d | 2 | 6.96-7.88 |
| e | 2 | 6.71-7.01 |
| f | 2 | 7.91-8.29 |
| g | 4 | 3.38-3.72 |
| h | 2 | 6.02-6.34 |
| i | 2 | 5.06-5.17 |
| j | 2 | 5.09-5.32 |
| k | 2 | 4.75-7.01 |

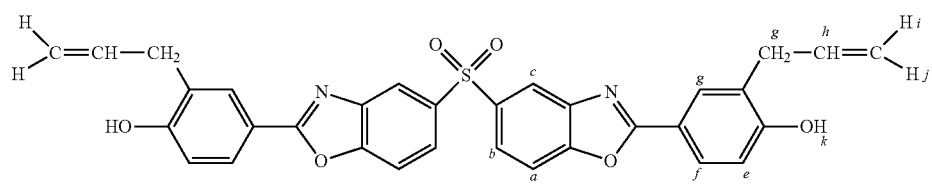

TABLE 4

| Peak | CHn | Chem. Shifts/ppm |
|---|---|---|
| 1 | C | 163.82 |
| 2 | C | 142.75 |
| 3 | C | 152.32 |
| 4 | CH | 110.77 |
| 5 | CH | 125.2 |
| 6 | C | 138.77 |
| 7 | CH | 119.68 |
| 8 | C | 121.4 |
| 9 | CH | 127.34 |
| 10 | C | 125.34 |
| 11 | C | 155.34 |
| 12 | CH | 115.41 |
| 13 | CH | 126.53 |
| 14 | CH2 | 35.6 |
| 15 | CH | 136.91 |
| 16 | CH2 | 115.85 |

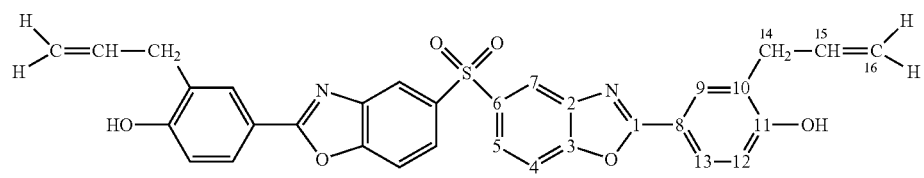

Synthesis Example 3

Synthesis of Benzoxazole Compound S-1c

In a 300-mL four-neck flask, 25.8 g (0.10 mol) of Compound C-1 and 62.0 g (0.20 mol) of Compound C-2 were dissolved in 100 g of NMP under a nitrogen stream. The contents were heated at 180° C. for reaction while removing the by-product phenol from the reaction system under reduced pressure. After the reaction system was heated for 3 hours, it was restored to atmospheric pressure. It was then heated at 200° C. whereupon ring-closing dehydration or cyclodehydration reaction was run for 20 hours. The cyclodehydration reaction was performed while removing water from the reaction system via a Dean-Stark trap. The reaction solution was added to 1,000 mL of water for reprecipitation. The crystal precipitate was collected and washed with deionized water and methanol. Finally the crystal was dried at 120° C. for 3 hours, obtaining 48.9 g of benzoxazole compound S-1c (yield 74.7%). The $^1$H-NMR and $^{13}$C-NMR data are shown in Tables 5 and 6, respectively.

TABLE 5

| Peak | nH | Chem. Shifts/ppm |
|---|---|---|
| a | 2 | 2.54-2.83 |
| b | 2 | 2.62-3.00 |
| c | 2 | 2.61 |
| d | 2 | 3.82-4.09 |
| e | 2 | 4.04-4.39 |
| f | 2 | 6.96-7.88 |
| g | 2 | 7.91-8.29 |
| h | 2 | 6.62-6.97 |
| i | 4 | 3.37-3.60 |
| j | 2 | 5.95-6.10 |
| k | 2 | 5.06 |
| l | 2 | 5.14 |
| m | 2 | 7.37-7.61 |
| n | 2 | 7.51-7.98 |
| o | 2 | 7.79-7.99 |
| p | 6 | 1.60-1.73 |

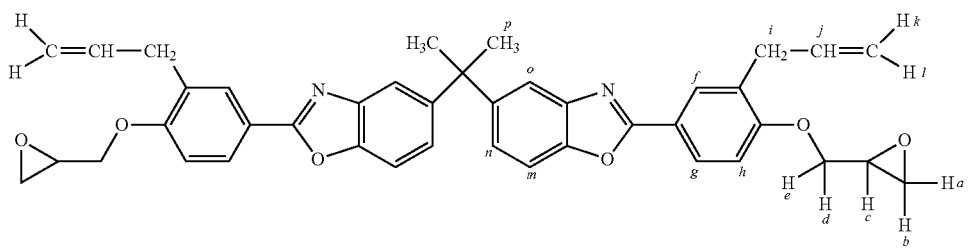 [SMILES: C=CCc1cc(-c2nc3cc(C(C)(C)c4ccc5oc(-c6ccc(OCC7CO7)c(CC=C)c6)nc5c4)ccc3o2)ccc1OCC1CO1]

TABLE 6

| Peak | CHn | Chem. Shifts/ppm |
|---|---|---|
| 1 | CH2 | 44.27 |
| 2 | CH | 50.38 |
| 3 | CH2 | 70.77 |
| 4 | C | 158.19 |
| 5 | C | 128.55 |
| 6 | CH | 128.42 |
| 7 | C | 122.6 |
| 8 | CH | 126.83 |
| 9 | CH | 113.66 |
| 10 | CH2 | 33.97 |
| 11 | CH | 136.93 |
| 12 | CH2 | 115.79 |
| 13 | C | 162.1 |
| 14 | C | 146.4 |
| 15 | C | 139.68 |
| 16 | CH | 110.23 |
| 17 | CH | 124.15 |
| 18 | C | 146.82 |
| 19 | CH | 119.97 |
| 20 | C | 45.92 |
| 21 | CH3 | 30.77 |

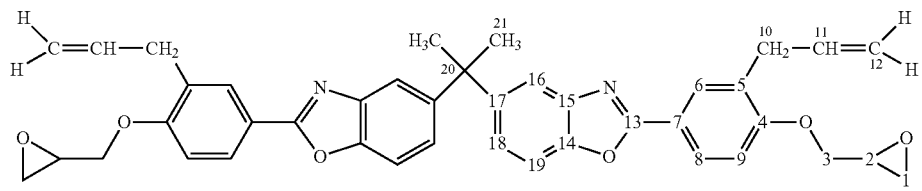

Synthesis of Silicone-Modified Polybenzoxazole Resin

Synthesis Example 4

Synthesis of Resin A

A 3-L flask equipped with a stirrer, thermometer, nitrogen purge line and reflux condenser was charged with 325.0 g (0.5 mol) of benzoxazole compound S-1a and 2,000 g of toluene and heated at 70° C. Thereafter, 1.0 g of a toluene solution of chloroplatinic acid (platinum concentration 0.5 wt %) was added, and 755.0 g (0.25 mol) of the compound having formula (S-2) wherein d=40 (Shin-Etsu Chemical Co., Ltd.) and 48.5 g (0.25 mol) of the compound having formula (S-4) (Shin-Etsu Chemical Co., Ltd.) were added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Resin A. On $^1$H-NMR and $^{29}$Si-NMR spectroscopy (Bruker Corp.), Resin A was identified to comprise repeating units of formulae (1a) and (1b). Resin A had a Mw of 42,000 and a silicone content of 66.9 wt %. In formulae (1a) and (1b), a=0.5 and b=0.5.

Synthesis Example 5

Synthesis of Resin B

A 3-L flask equipped with a stirrer, thermometer, nitrogen purge line and reflux condenser was charged with 282.0 g (0.5 mol) of benzoxazole compound S-1b and 2,000 g of toluene and heated at 70° C. Thereafter, 1.0 g of a toluene solution of chloroplatinic acid (platinum concentration 0.5 wt %) was added, and 151.0 g (0.05 mol) of the compound having formula (S-2) wherein d=40 (Shin-Etsu Chemical Co., Ltd.) and 87.3 g (0.45 mol) of the compound having formula (S-4) (Shin-Etsu Chemical Co., Ltd.) were added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Resin B. On $^1$H-NMR and $^{29}$Si-NMR spectroscopy, Resin B was identified to comprise repeating units of formulae (1a) and (1b). Resin B had a Mw of 44,000 and a silicone content of 66.9 wt %. In formulae (1a) and (1b), a=0.5 and b=0.5.

Synthesis Example 6

Synthesis of Resin C

A 3-L flask equipped with a stirrer, thermometer, nitrogen purge line and reflux condenser was charged with 327.0 g (0.5 mol) of benzoxazole compound S-1c and 2,000 g of toluene and heated at 70° C. Thereafter, 1.0 g of a toluene solution of chloroplatinic acid (platinum concentration 0.5 wt %) was added, and 1057.0 g (0.35 mol) of the compound having formula (S-2) wherein d=40 (Shin-Etsu Chemical Co., Ltd.) and 29.1 g (0.15 mol) of the compound having formula (S-4) (Shin-Etsu Chemical Co., Ltd.) were added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Resin C. On $^1$H-NMR and $^{29}$Si-NMR spectroscopy, Resin C was identified to comprise repeating units of formulae (1a) and (1b). Resin C had a Mw of 45,000 and a silicone content of 74.8 wt %. In formulae (1a) and (1b), a=0.7 and b=0.3.

Synthesis Example 7

Synthesis of Resin D

A 3-L flask equipped with a stirrer, thermometer, nitrogen purge line and reflux condenser was charged with 325.0 g (0.5 mol) of benzoxazole compound S-1a and 2,000 g of toluene and heated at 70° C. Thereafter, 1.0 g of a toluene solution of chloroplatinic acid (platinum concentration 0.5 wt %) was added, and 396.3 g (0.25 mol) of the compound having formula (S-2) wherein d=20 (Shin-Etsu Chemical Co., Ltd.) and 48.5 g (0.25 mol) of the compound having formula (S-4) (Shin-Etsu Chemical Co., Ltd.) were added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Resin D. On $^1$H-NMR and $^{29}$Si-NMR spectroscopy, Resin D was identified to comprise repeating units of formulae (1a) and (1b). Resin D had a Mw of 40,000 and a silicone content of 51.5 wt %. In formulae (1a) and (1b), a=0.5 and b=0.5.

Synthesis Example 8

Synthesis of Resin E

A 3-L flask equipped with a stirrer, thermometer, nitrogen purge line and reflux condenser was charged with 282.0 g (0.5 mol) of benzoxazole compound S-1b and 2,000 g of toluene and heated at 70° C. Thereafter, 1.0 g of a toluene solution of chloroplatinic acid (platinum concentration 0.5 wt %) was added, and 396.3 g (0.25 mol) of the compound having formula (S-2) wherein d=20 (Shin-Etsu Chemical Co., Ltd.) and 48.5 g (0.25 mol) of the compound having formula (S-4) (Shin-Etsu Chemical Co., Ltd.) were added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Resin E. On $^1$H-NMR and $^{29}$Si-NMR spectroscopy, Resin E was identified to comprise repeating units of formulae (1a) and (1b). The resin E has a Mw of 39,000 and a silicone content of 54.5 wt %. In formulae (1a) and (1b), a=0.5 and b=0.5.

Synthesis Example 9

Synthesis of Resin F

A 3-L flask equipped with a stirrer, thermometer, nitrogen purge line and reflux condenser was charged with 327.0 g (0.5 mol) of benzoxazole compound S-1c and 2,000 g of toluene and heated at 70° C. Thereafter, 1.0 g of a toluene solution of chloroplatinic acid (platinum concentration 0.5 wt %) was added, and 396.3 g (0.25 mol) of the compound having formula (S-2) wherein d=20 (Shin-Etsu Chemical Co., Ltd.) and 48.5 g (0.25 mol) of the compound having formula (S-4) (Shin-Etsu Chemical Co., Ltd.) were added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Resin F. On $^1$H-NMR and $^{29}$Si-NMR spectroscopy, Resin F was identified to comprise repeating units of formulae (1a) and (1b). Resin F had a Mw of 41,000 and a silicone content of 51.3 wt %. In formulae (1a) and (1b), a=0.5 and b=0.5.

Synthesis of Modified Silicone Resin

Comparative Synthesis Example 1

Synthesis of Resin G

A 3-L flask equipped with a stirrer, thermometer, nitrogen purge line and reflux condenser was charged with 215.0 g (0.5 mol) of the compound having formula (S-3a) and 2,000 g of toluene and heated at 70° C. Thereafter, 1.0 g of a toluene solution of chloroplatinic acid (platinum concentration 0.5 wt %) was added, and 906.0 g (0.30 mol) of the compound having formula (S-2) wherein d=40 (Shin-Etsu Chemical Co., Ltd.) and 38.8 to g (0.20 mol) of the compound having formula (S-4) (Shin-Etsu Chemical Co., Ltd.) were added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Resin G. Resin G had a Mw of 44,000 and a silicone content of 78.1 wt %.

Comparative Synthesis Example 2

Synthesis of Resin H

A 3-L flask equipped with a stirrer, thermometer, nitrogen purge line and reflux condenser was charged with 196.0 g (0.5 mol) of the compound having formula (S-3b) and 2,000 g of toluene and heated at 70° C. Thereafter, 1.0 g of a toluene solution of chloroplatinic acid (platinum concentration 0.5 wt %) was added, and 317.0 g (0.20 mol) of the compound having formula (S-2) wherein d=20 (Shin-Etsu Chemical Co., Ltd.) and 58.2 g (0.30 mol) of the compound having formula (S-4) (Shin-Etsu Chemical Co., Ltd.) were added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Resin H. Resin H had a Mw of 41,000 and a silicone content of 55.5 wt %.

Preparation of Photosensitive Resin Compositions

Examples 1 to 11 and Comparative Examples 1 to 2

Photosensitive resin compositions were prepared by combining the resin (in each Synthesis Example), photoacid generator, crosslinker, solvent, and basic compound in accordance with the formulation shown in Table 7, agitating them at room temperature until dissolution, and precision filtering through a Teflon® filter with a pore size of 1.0 μm.

TABLE 7

| | Component (pbw) | | Example 1 | 2 | 3 | 4 | 5 | 6 | 7 | 8 | 9 | 10 | 11 | Comparative Example 1 | 2 |
|---|---|---|---|---|---|---|---|---|---|---|---|---|---|---|---|
| (A) | Silicone-modified polybenzoxazole resin | Resin A | 100 | | | | | | 100 | 100 | 100 | 100 | 100 | | |
| | | Resin B | | 100 | | | | | | | | | | | |
| | | Resin C | | | 100 | | | | | | | | | | |
| | | Resin D | | | | 100 | | | | | | | | | |
| | | Resin E | | | | | 100 | | | | | | | | |
| | | Resin F | | | | | | 100 | | | | | | | |
| | Modified silicone resin | Resin G | | | | | | | | | | | | 100 | |
| | | Resin H | | | | | | | | | | | | | 100 |
| (B) | PAG | PAG-1 | 1 | 1 | 1 | 1 | 1 | 1 | 1 | 0.1 | 10 | 1 | 1 | 1 | 1 |
| (C) | Crosslinker | CL-1 | 10 | 10 | 10 | 10 | 10 | 10 | 10 | 10 | 10 | 25 | 1 | 10 | 10 |
| | | CL-2 | 3 | 3 | 3 | 3 | 3 | 3 | 3 | 3 | 3 | 5 | 1 | 3 | 3 |
| (D) | Solvent | cyclopentanone | 55 | 55 | 55 | 55 | 55 | 55 | 55 | 55 | 55 | 55 | 55 | 55 | 55 |
| (E) | Basic compound | AM-1 | | | | | | | 0.1 | | | | | | |

In Table 7, photoacid generator PAG-1, crosslinkers CL-1 and CL-2, and basic compound AM-1 are as identified below.

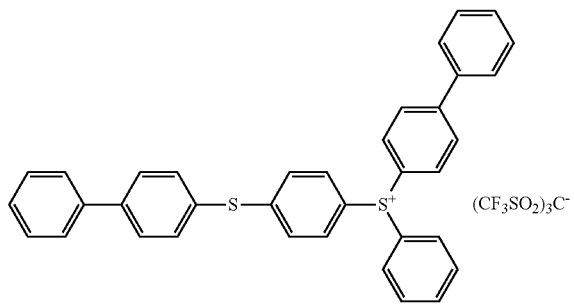

PAG-1

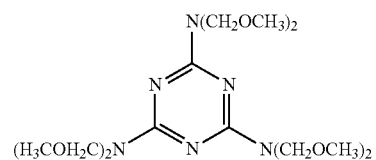

CL-1

-continued

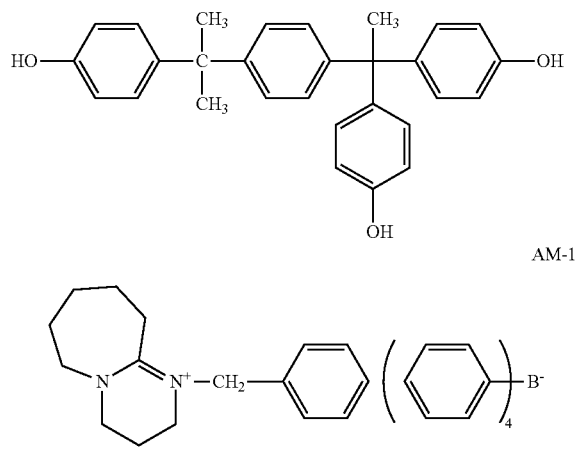

CL-2

AM-1

Preparation of Photosensitive Dry Film

A die coater was used as the film coater and a polyethylene terephthalate (PET) film of 38 μm thick used as the support film. Each of the photosensitive resin compositions in Table 7 was coated onto the support film. The coated film was passed through a hot air circulating oven (length 4 m) set at 100° C. over 5 minutes to form a photosensitive resin coating on the support film, yielding a photosensitive dry film. Using a laminating roll, a polyethylene film of 50 μm thick as the protective film was bonded to the photosensitive resin coating under a pressure of 1 MPa, yielding a protective film-bearing photosensitive dry film. The thickness of each photosensitive resin coating is tabulated in Table 8. The thickness of a resin coating was measured by an optical interference film thickness gauge.

Evaluation of Resin Coating (1) Pattern Formation and Evaluation

From the protective film-bearing photosensitive dry film, the protective film was stripped off. Using a vacuum laminator TEAM-100RF (Takatori Corp.) with a vacuum chamber set at a vacuum of 80 Pa, the photosensitive resin coating on the support film was closely bonded to a migration test substrate (comb-shaped electrode-bearing substrate, conductor: copper, conductor spacing and width: 20 μm, conductor thickness: 4 μm). The temperature was 110° C. After restoration of atmospheric pressure, the substrate was taken out of the laminator, and the support film was stripped off. Then the photosensitive resin coating was prebaked on a hot plate at 130° C. for 5 minutes for enhancing adhesion to the substrate.

Next, using a contact aligner exposure tool, the photosensitive resin coating was exposed to radiation of 405 nm through a mask having a line-and-space pattern and a contact hole pattern. After exposure, the coated substrate was baked (PEB) on a hot plate at 120° C. for 5 minutes and cooled. This was followed by spray development in propylene glycol monomethyl ether acetate (PGMEA) for 300 seconds for forming a pattern of the resin coating.

The patterned photosensitive resin coating on the substrate was post-cured in an oven at 180° C. for 2 hours while the oven was purged with nitrogen. Under a scanning electron microscope (SEM), the contact hole patterns of 100 μm, 80 μm, 60 μm, 40 μm, and 20 μm were observed in cross section, with the minimum hole pattern in which holes extended down to the film bottom being reported as maximum resolution. From the cross-sectional photo, the contact hole pattern of 80 μm was evaluated for perpendicularity, and rated excellent (⊚) for perpendicular pattern, good (○) for slightly inversely tapered profile, fair (Δ) for inversely tapered profile, and poor (x) for opening failure.

(2) Evaluation of Electric Properties (Dielectric Breakdown Strength)

For the evaluation of dielectric breakdown strength of a photosensitive resin coating of a photosensitive resin composition, each of the photosensitive resin compositions in Table 7 was coated onto a steel plate of 13 cm×15 cm×0.7 mm (thick) by means of a bar coater and heated in an oven at 180° C. for 2 hours to form a photosensitive resin coating. The resin composition was coated such that the resulting coating had a thickness of 0.2 μm. The resin coating was tested by a breakdown tester TM-5031AM (Tama Densoku Co., Ltd.) to determine the dielectric breakdown strength thereof.

(3) Evaluation of Reliability (Adhesion, Crack Resistance)

Each of the photosensitive resin film-bearing wafers after pattern formation and post-cure in Examples 1 to 11 and Comparative Examples 1 to 2 was cut into specimens of 10 mm squares using a dicing saw with a dicing blade (DAD685 by DISCO Co., spindle revolution 40,000 rpm, cutting rate 20 mm/sec). Ten specimens for each Example were examined by a thermal cycling test (test of holding at −25° C. for 10 minutes and holding at 125° C. for 10 minutes, the test being repeated 1,000 cycles). After the test, it was observed whether or not the resin film peeled from the wafer and whether or not the resin film cracked. The sample was rated "good" when all specimens did not peel or crack, "peeled" when one or more specimens peeled, and "cracked" when one or more specimens cracked.

(4) Evaluation of Heat Resistance

Prior to a heating test, the weight of a specimen (prepared in the above reliability evaluation) was measured. The specimen was held in an oven at 200° C. for 1,000 hours, taken out of the oven, and measured for weight again. The sample was rated good when the weight change before and after the test was less than 0.5%, and poor when the weight change before and after the test was equal to or more than 0.5%.

(5) Evaluation of Chemical Resistance

To examine the solvent resistance of a photosensitive resin coating, especially resistance to NMP which is frequently used in the fabrication of semiconductor devices, a pattern of 10 mm×10 mm was formed on a wafer from each composition by the same procedure as in (3) Evaluation of reliability. The pattern-bearing wafer was immersed in NMP at room temperature for 1 hour, after which it was examined for a film thickness change and outer appearance for evaluating chemical resistance. The sample was rated good (○) when no changes of film thickness and appearance were observed, and poor (x) when any film thickness increase and swell were observed.

The test results of the resin coatings of the photosensitive resin compositions in Table 7 are tabulated in Table 8.

TABLE 8

|  | Example | | | | | | | | | | | Comparative Example | |
| --- | --- | --- | --- | --- | --- | --- | --- | --- | --- | --- | --- | --- | --- |
|  | 1 | 2 | 3 | 4 | 5 | 6 | 7 | 8 | 9 | 10 | 11 | 1 | 2 |
| Photosensitive resin coating (μm) | 100.4 | 100.5 | 99.7 | 101.0 | 100.1 | 99.9 | 99.7 | 100.2 | 98.9 | 99.7 | 100.9 | 100.3 | 100.5 |
| Contact hole pattern profile | ○ | ○ | ○ | ○ | ○ | ○ | ⊚ | ○ | ○ | ○ | ○ | ○ | ○ |
| Maximum resolution (μm) | 100 | 100 | 100 | 100 | 100 | 100 | 60 | 80 | 100 | 100 | 80 | 100 | 100 |
| Electric property (V/μm) | 545 | 575 | 520 | 580 | 495 | 500 | 485 | 525 | 555 | 530 | 515 | 540 | 570 |
| Reliability Peel | Good | Good | Good | Good | Good | Good | Good | Good | Good | Good | Good | Peeled | Peeled |
| Crack | Good | Good | Good | Good | Good | Good | Good | Good | Good | Good | Good | Cracked | Cracked |
| Heat resistance | Good | Good | Good | Good | Good | Good | Good | Good | Good | Good | Good | Poor | Poor |
| Chemical resistance | ○ | ○ | ○ | ○ | ○ | ○ | ○ | ○ | ○ | ○ | ○ | X | X |

As is evident from the test results, the photosensitive resin compositions within the scope of the invention experience little film thickness loss, exhibit good resolution, i.e., sufficient properties as photosensitive material, and the resin coatings obtained therefrom have improved electric properties (e.g., dielectric breakdown strength), heat resistance and chemical resistance, as well as improved adhesion and crack resistance after the thermal cycling test, and are thus useful as protective film for circuits and electronic parts. Thus photosensitive dry films having more reliability are available.

Japanese Patent Application No. 2017-018353 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photosensitive resin composition comprising (A) a silicone-modified polybenzoxazole resin comprising repeating units having the formula (1a) and repeating units having the formula (1b), and (B) a photoacid generator which is decomposed to generate an acid upon exposure to radiation of wavelength 190 to 500 nm,

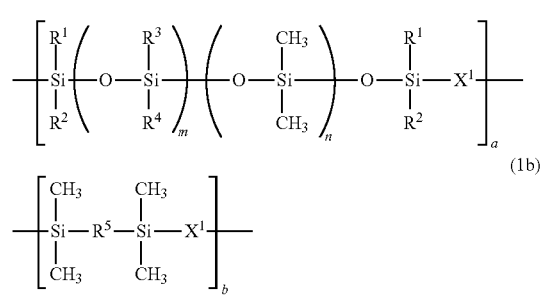

wherein $R^1$ to $R^4$ are each independently a $C_1$-$C_8$ monovalent hydrocarbon group which may contain a glycidyl, acryloyl or methacryloyl moiety, m and n are each independently an integer of 0 to 300, $R^5$ is a straight, branched or cyclic $C_1$-$C_8$ alkylene group or phenylene group, a and b are positive numbers in the range: 0<a<1, 0<b<1, and a+b=1, and $X^1$ is a divalent linker having the following formula (2):

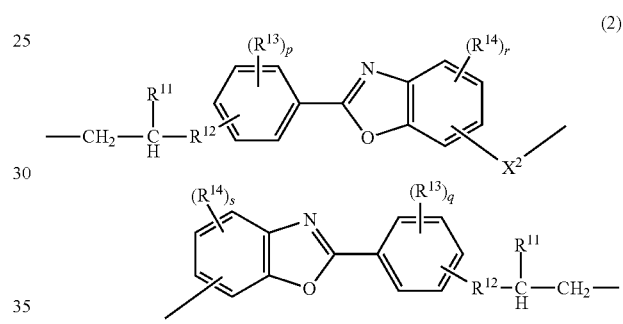

wherein $X^2$ is a single bond or divalent organic group, $R^{11}$ is each independently hydrogen or a $C_1$-$C_8$ monovalent hydrocarbon group in which some hydrogen may be substituted by halogen, $R^{12}$ is each independently a straight, branched or cyclic $C_1$-$C_8$ alkylene group in which any methylene moiety may be substituted by an ether bond or phenylene moiety, $R^{13}$ is each independently a hydroxyl or glycidyloxy group, $R^{14}$ is each independently a $C_1$-$C_8$ monovalent hydrocarbon group in which some hydrogen may be substituted by halogen, p and q are each independently an integer of 0 to 4, and r and s are each independently an integer of 0 to 3.

2. The photosensitive resin composition of claim 1 wherein $X^2$ is a group selected from the following groups:

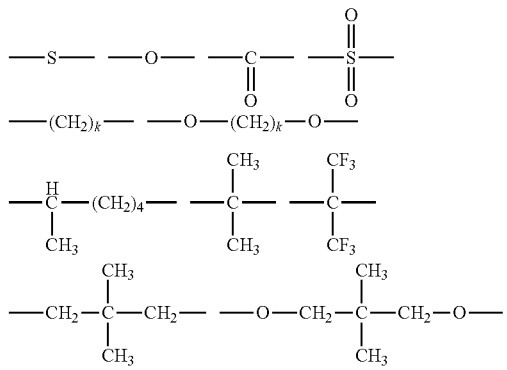

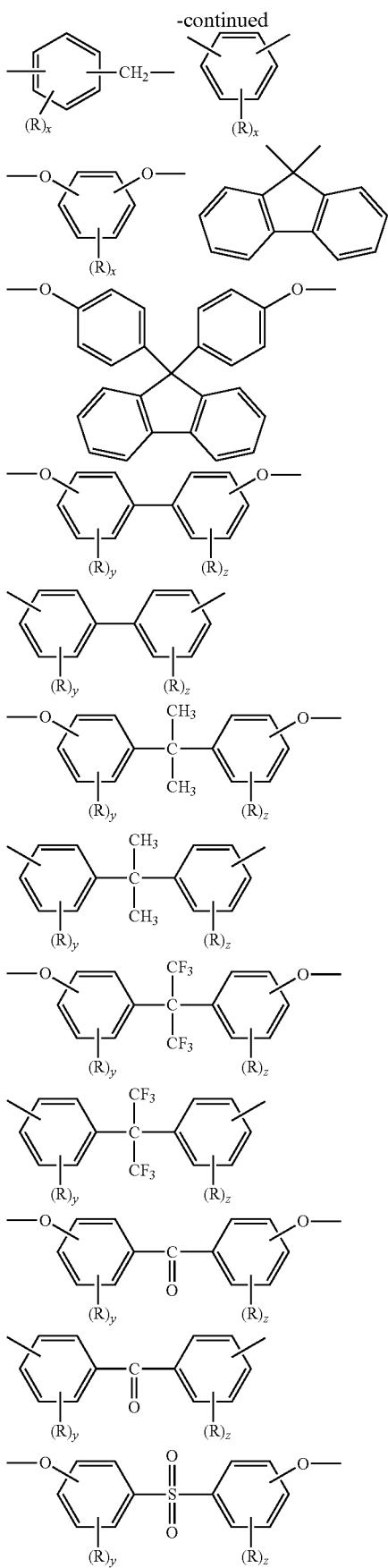

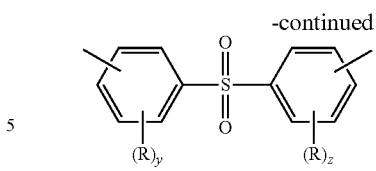

wherein R is each independently halogen, or a straight, branched or cyclic $C_1$-$C_8$ alkyl or haloalkyl group, k is an integer of 1 to 6, x is an integer of 0 to 4, and y and z are each independently an integer of 0 to 4.

3. The photosensitive resin composition of claim 1, further comprising (C) a crosslinker.

4. The photosensitive resin composition of claim 3 wherein the crosslinker (C) is at least one compound selected from the group consisting of an amino condensate modified with formaldehyde or formaldehyde-alcohol, a phenol compound having on the average at least two methylol or alkoxymethylol groups in the molecule, and an epoxy compound having on the average at least two epoxy groups in the molecule.

5. The photosensitive resin composition of claim 1, further comprising (E) a basic compound.

6. The photosensitive resin composition of claim 1, which is a substrate bonding material for bonding two substrates.

7. A photosensitive resin coating comprising (A) a silicone-modified polybenzoxazole resin comprising repeating units having the formula (1a) and repeating units having the formula (1b), and (B) a photoacid generator which is decomposed to generate an acid upon exposure to radiation of wavelength 190 to 500 nm,

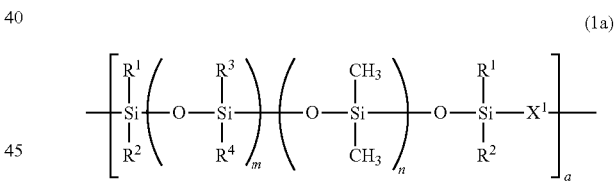
(1a)

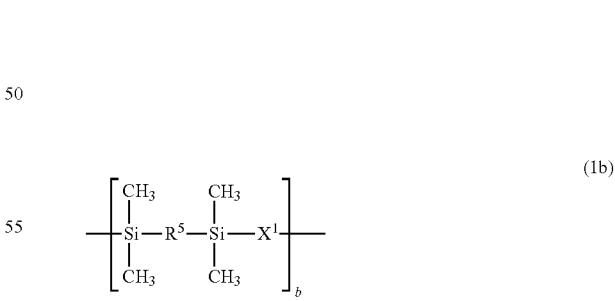
(1b)

wherein $R^1$ to $R^4$ are each independently a $C_1$-$C_8$ monovalent hydrocarbon group which may contain a glycidyl, acryloyl or methacryloyl moiety, m and n are each independently an integer of 0 to 300, $R^5$ is a straight, branched or cyclic $C_1$-$C_8$ alkylene group or phenylene group, a and b are positive numbers in the range: $0<a<1$, $0<b<1$, and $a+b=1$, and $X^1$ is a divalent linker having the following formula (2):

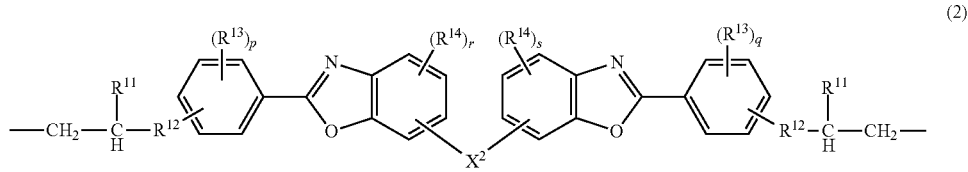

(2)

wherein $X^2$ is a single bond or divalent organic group, $R^{11}$ is each independently hydrogen or a $C_1$-$C_8$ monovalent hydrocarbon group in which some hydrogen may be substituted by halogen, $R^{12}$ is each independently a straight, branched or cyclic $C_1$-$C_8$ alkylene group in which any methylene moiety may be substituted by an ether bond or phenylene moiety, $R^{13}$ is each independently a hydroxyl or glycidyloxy group, $R^{14}$ is each independently a $C_1$-$C_8$ monovalent hydrocarbon group in which some hydrogen may be substituted by halogen, p and q are each independently an integer of 0 to 4, and r and s are each independently an integer of 0 to 3.

8. A photosensitive dry film comprising a support film and the photosensitive resin coating of claim 7 thereon.

9. A laminate comprising a substrate and the photosensitive resin coating of claim 7 thereon.

10. A pattern forming process comprising the steps of:
(i) coating the photosensitive resin composition of claim 1 onto a substrate to form a photosensitive resin coating,
(ii) exposing a predetermined region of the photosensitive resin coating to radiation through a photomask and post-exposure baking, and
(iii) developing the exposed resin coating in a developer to dissolve away the unexposed region of the resin coating and to form a pattern of the resin coating.

11. A pattern forming process comprising the steps of:
(i) attaching the photosensitive dry film of claim 8 at its photosensitive resin coating to a substrate,
(ii) exposing a predetermined region of the photosensitive resin coating to radiation through a photomask and post-exposure baking, and
(iii) developing the photosensitive resin coating as post-exposure baked in a developer to dissolve away the unexposed region of the resin coating and to form a pattern of the resin coating.

12. The pattern forming process of claim 10, further comprising (iv) post-curing the patterned coating resulting from development step (iii) at a temperature of 100 to 250° C.

* * * * *